United States Patent
Tomita et al.

(10) Patent No.: US 9,380,697 B2
(45) Date of Patent: Jun. 28, 2016

(54) ELECTRONIC DEVICE AND MANUFACTURING METHOD FOR SAME

(71) Applicant: Panasonic Intellectual Property Management Co., Ltd., Osaka (JP)

(72) Inventors: Yoshihiro Tomita, Osaka (JP); Mitsuhiro Kasahara, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/583,358

(22) Filed: Dec. 26, 2014

(65) Prior Publication Data

US 2015/0216037 A1    Jul. 30, 2015

(30) Foreign Application Priority Data

Jan. 28, 2014  (JP) .................................. 2014-013548

(51) Int. Cl.
| | |
|---|---|
| H05K 1/02 | (2006.01) |
| H05K 3/28 | (2006.01) |
| H05K 3/00 | (2006.01) |
| H01L 23/00 | (2006.01) |
| H01L 21/56 | (2006.01) |

(Continued)

(52) U.S. Cl.
CPC .............. *H05K 1/0283* (2013.01); *H01L 24/96* (2013.01); *H01L 21/568* (2013.01); *H01L 2224/18* (2013.01); *H01L 2224/45144* (2013.01); *H01L 2224/48091* (2013.01); *H01L 2224/49107* (2013.01); *H01L 2224/73265* (2013.01); *H05K 3/007* (2013.01); *H05K 3/0014* (2013.01); *H05K 3/146* (2013.01); *H05K 3/18* (2013.01); *H05K 3/28* (2013.01); *H05K 2201/0311* (2013.01); *H05K 2201/0314* (2013.01); *H05K 2201/0382* (2013.01); *H05K 2201/09036* (2013.01); *H05K 2201/09118* (2013.01); *H05K 2201/09263* (2013.01); *H05K 2201/1028* (2013.01); *H05K 2201/10265* (2013.01);

(Continued)

(58) Field of Classification Search
CPC ................. H01L 2924/01079; H01L 2924/14; H01L 2924/01029; H01L 2924/01078; H01L 2224/48091
See application file for complete search history.

(56) References Cited

U.S. PATENT DOCUMENTS

| | | | |
|---|---|---|---|
| 2004/0104113 A1* | 6/2004 | Tomita | .................. C25D 17/10 204/290.01 |
| 2006/0183269 A1 | 8/2006 | Fuergut et al. | |

(Continued)

FOREIGN PATENT DOCUMENTS

| | | |
|---|---|---|
| JP | 8-172219 | 7/1996 |
| JP | 2003-216072 | 7/2003 |

(Continued)

*Primary Examiner* — Mohsen Ahmadi
*Assistant Examiner* — Long Le
(74) *Attorney, Agent, or Firm* — Renner, Otto, Boisselle & Sklar, LLP

(57) ABSTRACT

An electronic device includes: electronic elements; expandable and contractible conductors each disposed between two of the electronic elements adjacent to each other; a seal which covers the electronic elements and the conductors except principal surfaces of the electronic elements and first surfaces of the conductors, the principal surfaces of the electronic elements and the first surfaces of the conductors being present on a same plane on which surfaces of the seal are present; and leading electrode films each of which is attached in a film-like form to three surfaces which are the surface of the seal positioned between one of the electronic elements and one of the conductors, the first surface of the conductor, and part of the principal surface of the electronic element, to electrically connect the electronic element and the conductor through the leading electrode film.

22 Claims, 16 Drawing Sheets

(51) Int. Cl.
  *H05K 3/14*     (2006.01)
  *H05K 3/18*     (2006.01)

(52) U.S. Cl.
  CPC ............ *H05K 2203/0191* (2013.01); *H05K 2203/1469* (2013.01); *H05K 2203/308* (2013.01); *Y10T 29/49146* (2015.01)

(56) References Cited

U.S. PATENT DOCUMENTS

2007/0212813 A1* 9/2007 Fay .................. H01L 21/568
                                              438/106
2007/0267136 A1  11/2007 Tuominen et al.
2009/0085045 A1   4/2009 Marion et al.
2009/0160043 A1*  6/2009 Shen ................. H01L 21/568
                                              257/690
2011/0001238 A1*  1/2011 Wakisaka ........... H01L 21/561
                                              257/738
2014/0203239 A1*  7/2014 Schubert ............. H01L 33/62
                                              257/13

FOREIGN PATENT DOCUMENTS

JP    2008-522396    6/2008
JP    2009-543367   12/2009

* cited by examiner

REMOVE DUMMY MEMBERS 90

ELECTRONIC DEVICE AND MANUFACTURING METHOD FOR SAME

This application claims priority to Japanese Patent Application No. 2014-013548, filed on Jan. 28, 2014, the contents of which are hereby incorporated by reference.

BACKGROUND

1. Technical Field

The present disclosure relates to an electronic device and a manufacturing method for the electronic device. More particularly, the present disclosure relates to an electronic device including a plurality of electronic elements, and a manufacturing method for the electronic device.

2. Description of the Related Art

In the field of electronics, various types of electronic devices have been developed with progress in development of electronic equipment. Those electronic devices are provided, for example, in the "form using a circuit substrate" and the "form using a lead frame".

See the following Patent Literatures; U.S. Pat. No. 7,927,922, U.S. Pat. No. 7,202,107, Japanese Unexamined Patent Application Publication (Translation of PCT Application) No. 2008-522396, and Japanese Unexamined Patent Application Publication No. 58-130375.

SUMMARY

The present inventors have found that connection reliability of the related-art electronic devices is not sufficient.

According to one aspect of the present disclosure, An electronic device includes: electronic elements having principal surfaces; expandable and contractible conductors each disposed between two of the electronic elements adjacent to each other, and each having a first surface; a seal which covers the electronic elements and the conductors except the principal surfaces of the electronic elements and the first surfaces of the conductors, the principal surfaces of the electronic elements and the first surfaces of the conductors being present on a same plane on which surfaces of the seal each positioned between one of the electronic elements and one of the conductors are present; and leading electrode films each of which is attached in a film-like form to three surfaces which are the surface of the seal positioned between one of the electronic elements and one of the conductors, the first surface of the conductor, and part of the principal surface of the electronic element, to electrically connect the electronic element and the conductor through the leading electrode film.

It should be noted that general or specific embodiments may be implemented as a device, a system, a method, an integrated circuit, or any elective combination thereof.

The electronic device according to one aspect of the present disclosure can increase the connection reliability.

Additional benefits and advantages of the disclosed embodiments will be apparent from the specification and Figures. The benefits and/or advantages may be individually provided by the various embodiments and features of the specification and Figures, and need not all be provided in order to obtain one or more of the same.

BRIEF DESCRIPTION OF THE DRAWINGS

FIG. 6A illustrates a bellows shaped conductor, FIG. 6B illustrates a spiral shaped conductor, and FIG. 6C illustrates a rubber-like conductor containing conductive fillers.

DETAILED DESCRIPTION OF THE EMBODIMENTS (Underlying Knowledge Forming Basis of the Present Disclosure)

Figure 18A:
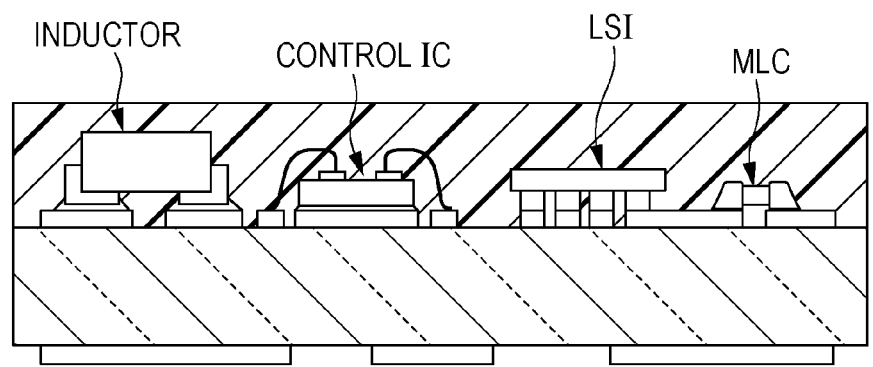
FIGS. 18A and 18B are cross sectional views illustrating, in a schematic way, forms of related-art electronic devices.
Figure 18B:
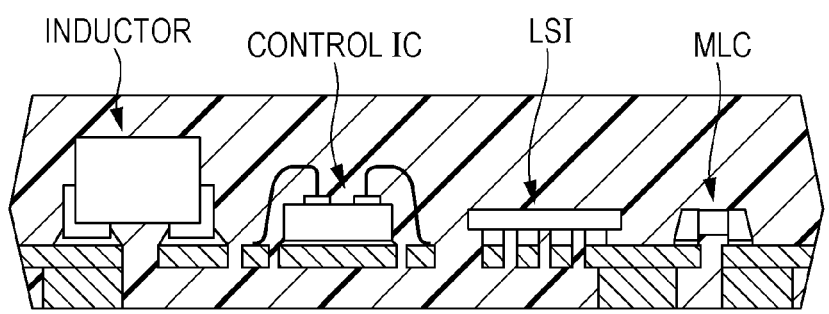

In the "form using a circuit substrate", electronic elements are mounted on the circuit substrate (see FIG. 18A). That device form is generally divided into the "wire bonding (W/B) type" and the "flip chip (F/C) type". On the other hand, the "form using a lead frame" includes the lead frame that is formed by leads, die pads, and so on (see FIG. 18B). In any of the form using the circuit substrate and the form using the lead frame, various electronic elements are bonded by soldering, for example.

As a result of conducting intensive studies on matters regarding flexibility and elasticity in relation to electronic devices, the inventors have accomplished the present disclosure. Accordingly, the processes to the accomplishment of the present disclosure are first described.

Electronic devices are demanded to have flexibility more suitably adapted for increasing variety of applications. For instance, conventional displays are flat displays formed on rectangular glass substrates. However, there are needs for a display capable of being arranged in a curved surface shape in conformity with a form of a smartphone, and a display capable of being arranged along a cylindrically curved surface to be used as a signage. Other conceivable examples of commercially demanded displays are a display that has such a degree of flexibility as allowing the display to be installed along a free curved surface, and a display that has such a degree of elasticity as allowing the display to be mounted on a wearable device. In addition, it is thought that various types of electronic devices, including sensors and peripheral circuits, will also be demanded to have elasticity in future.

One example of flexible electronic devices is a flexible display in which a plurality of surface-mounting packaged LEDs is mounted on a flexible substrate by soldering. Another example is an LED display in which LED elements are directly mounted on a flexible substrate, and element electrodes are led out through connection of metal leads or by wire bonding.

Under the forgoing situations, the inventors have found the following matters in relation to the above-mentioned electronic devices.

In any type of flexible display, elements are mounted on a flexible substrate, and the flexible substrate is formed by employing a resin sheet made of polyimide, for example. Thus, the flexible display is flexibly bendable. However, because elasticity of the resin sheet in the planar direction is poor, it is difficult to realize a device having practically sufficient elasticity even though a flexible device can be realized.

In the flexible display using the surface-mounting packaged LEDs, a package has a relatively large external size, and a relatively large pad area is required for connection of the LED. Accordingly, a difficulty arises in arranging an LED array at a high density. Stated in another way, even though such a display is flexible, high definition needed as the display cannot be realized.

When the LED elements are directly mounted on the flexible substrate, an LED mounting area can be reduced and a display having high definition can be realized. In order to lead out electrodes of the LED elements, however, metal leads or metal wires have to be directly bonded to element electrodes. When that type of flexible substrate is subjected to bending or expansion/contraction, a problem of disconnection or breakage of the leading electrode portions may occur. Specifically, in the case using a fat metal lead for connection, stress tends to concentrate at a bonded point between the metal lead and the LED element, and breakage may occur at the bonded point. In the case using a thin metal wire, the wire itself may yield to the bending or expansion/contraction force, thus causing disconnection.

The inventors have conducted intensive studies on the matters found as described above. Since the present disclosure has been accomplished through the above-described processes, the present disclosure "providing an electronic device that realizes an increase of connection reliability" has been made from a novel viewpoint instead of following the concept of the related art. In other words, embodiments of the present disclosure have been conceived by the inventors as a result of conducting intensive studies on an electronic device that can realize improvements in the matters related to "flexibility" and "elasticity".

(Electronic Device of Present Disclosure)

An electronic device according to one embodiment of the present disclosure will be described below with reference to the drawings. It is to be noted that various elements illustrated in the drawings are depicted in a schematic way just for understanding of the present disclosure, and that dimensional ratios, external appearances, etc. of the elements may be different from actual ones.

Figure 1:
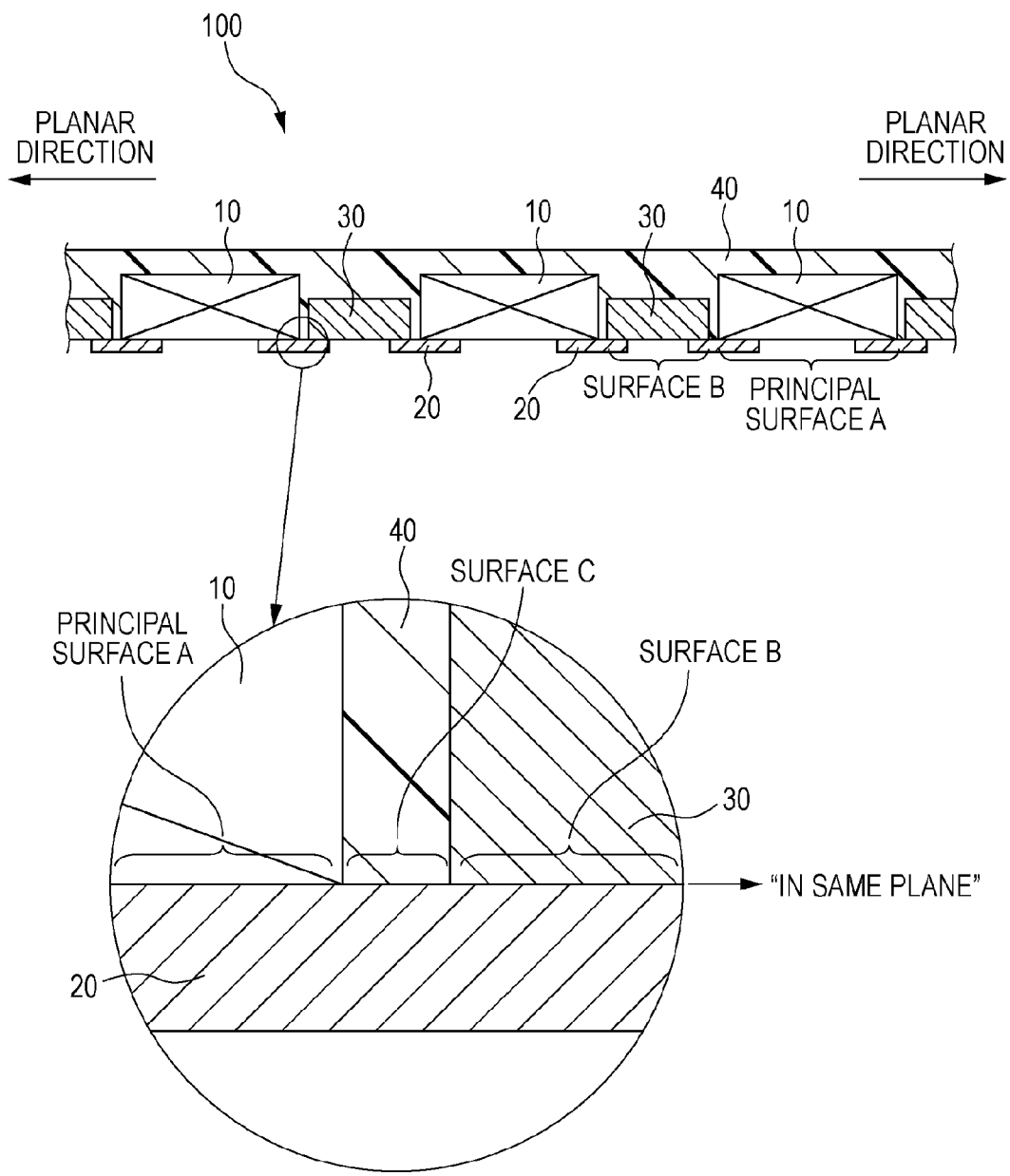
FIG. 1 is a cross sectional view illustrating, in a schematic way, a configuration of an electronic device according to an embodiment of the present disclosure.

FIG. 1 illustrates, in a schematic way, an electronic device 100 of the present disclosure. The electronic device 100 of the present disclosure includes a plurality of electronic elements 10. As illustrated in FIG. 1, the electronic device 100 of the present disclosure includes, in addition to the electronic elements 10, at least leading electrode films 20, expandable and contractible conductors 30, and a seal 40.

The plural electronic elements 10 are arranged along a direction ("planar direction") perpendicular to the thickness direction of the electronic device 100. The leading electrode films 20 are each disposed in a state connected to a part of a principal surface of one of the electronic element 10. The expandable and contractible conductors 30 are each disposed between two of the electronic elements 10 adjacent to each other. The seal 40 is disposed to cover the electronic elements 10 and the expandable and contractible conductors 30.

In particular, the seal 40 covers the electronic elements 10 and the expandable and contractible conductors 30 such that their partial surfaces are exposed. More specifically, as illustrated in FIG. 1, the seal 40 covers the electronic elements 10 and the expandable and contractible conductors 30 such that a principal surface A of each electronic element 10 and a surface B of each expandable and contractible conductor 30 are exposed from the seal 40.

In the electronic device 100 of the present disclosure, the feature of "three surfaces in one plane" is realized. Specifically, respective surfaces of the electronic element 10, the expandable and contractible conductor 30, and the seal 40 are present in the same plane. More specifically, as illustrated in an enlarged view of FIG. 1, the "principal surface A of the electronic element 10 exposed from the seal", the "surface B of the expandable and contractible conductor 30 exposed from the seal", and a "surface C of the seal 40 positioned between the electronic element 10 and the expandable and contractible conductor 30 (particularly, a surface of the seal on the side where the exposed surfaces of the electronic element and the expandable and contractible conductor are present)" are positioned in the same plane. The expression "in the same plane" used here implies "substantially in the same plane", and it does not imply "exactly in the same plane". To explain such a point in a practical sense, the feature of "being in the same plane" in the present disclosure involves an embodiment in which level differences among the principal surface A, the surface B, and the surface C fall within the range of ±0 to 10 μm. The surfaces C of the seal 40, each of which are located between one of the electronic elements 10 and one of the expandable and contractible conductors 30, are parts of one surface having openings for the electronic elements 10 and the expandable and contractible conductors 30.

The leading electrode film 20 is disposed in a state attached to the "three surfaces in one plane". Specifically, as illustrated in the enlarged view of FIG. 1, the leading electrode film 20 is in a state attached to the "exposed principal surface A of the electronic element 10", the "exposed surface B of the expandable and contractible conductor 30", and the "surface C of the seal 40 positioned between the electronic element 10 and the expandable and contractible conductor 30". In particular, because the leading electrode film 20 is in the form of a "film", it is in a state attached to those three surfaces (i.e., the principal surface A, the surface B, and the surface C) over a wide spreading region. In this example, two electrode films 20 are attached to one expandable and contractible conductor 30. Those two electrode films 20 are not directly connected. Thus, the expandable and contractible conductor 30 can expand and contract easily without damaging the electrode films 20.

The expression "state attached in the film-like form" used in this specification implies a state where a relatively thin film (in the present disclosure, a film that is "thin" when looking at the entirety of the device) in comparative sense is closely contacted with the three surfaces in one plane over a wide spreading region. Taking a more understandable familiar case as an example, a state where a thin film, such as a wrapping film, is closely contacted with the "three surfaces" over a widely spreading two-dimensional planar region corresponds to the "state attached in the film-like form" expressed in the present disclosure.

Thus, since the leading electrode film 20 is bonded to the "exposed principal surface A of the electronic element 10" and the "exposed surface B of the expandable and contractible conductor 30", the electronic element 10 and the expandable and contractible conductor 30 are electrically connected to each other through the leading electrode film 20.

The electronic device 100 of the present disclosure includes the expandable and contractible conductors 30 covered with the seal 40. More specifically, the plural expandable and contractible conductors 30 are each positioned in a region between the electronic elements 10 adjacent to each other. The term "expandable and contractible conductor" used in the present disclosure implies, as suggested from the naming, a conductor having both "conductivity" and "elasticity". In particular, the "conductivity" implies an electrical conduction characteristic at such a level as allowing electrical conduction to be established between conductors connected to the expandable and contractible conductor 30. The "elasticity" implies characteristics of expansion and contraction particularly in directions perpendicular to the thickness direction of the electronic device (i.e., in the "planar direction" illustrated in FIG. 1).

Figure 3:
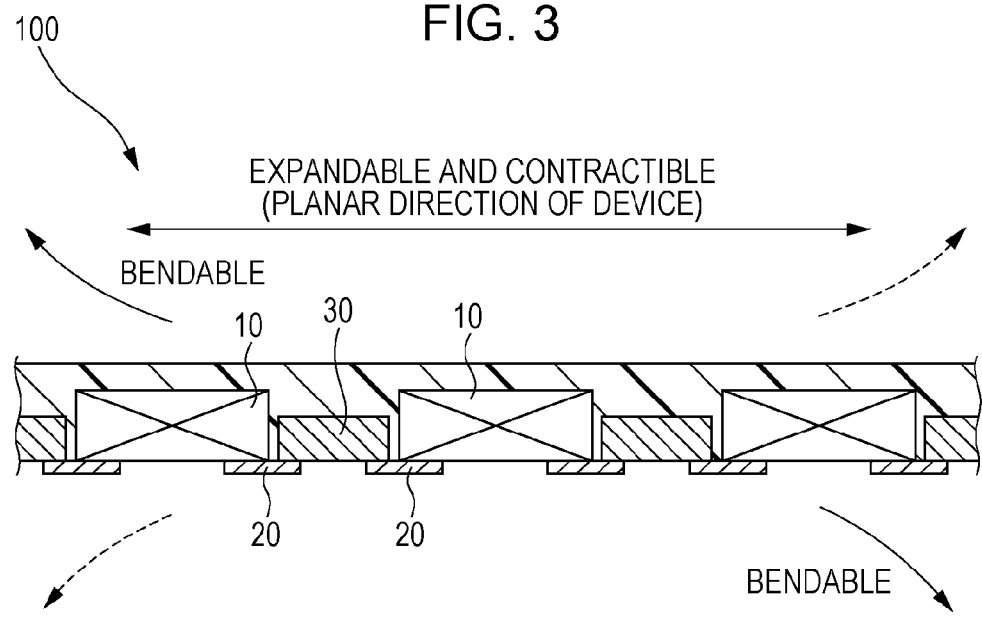
FIG. 3 is a cross sectional view to explain expandable/contractible characteristics and bendable characteristics of the electronic device according to an embodiment of the present disclosure.

As seen from an embodiment illustrated in FIG. 3, the expandable and contractible conductor 30 is disposed to bridge two leading electrode films 20 connected respectively to two of the electronic elements 10 that are adjacent to each other. With the expandable and contractible conductors 30 arranged as described above, the electronic device 100 is expandable and contractible in its entirety. Thus, the expandable and contractible electronic device 100 is provided according to one embodiment of the present disclosure. The expression "expandable and contractible" or "elasticity" used in the present disclosure implies that the electronic device is expandable and contractible in the direction perpendicular to the thickness direction of the electronic device (i.e., expandable and contractible in the "planar direction") (see FIG. 3). More specifically, the expandable and contractible electronic device of the present disclosure is able to expand in the "planar direction" when an external force acting to extend the electronic device in the "planar direction" is applied, and is able to contract for return to an original state when the applied external force is released. Additionally, the expandable and contractible electronic device is not only expendable as described above, but also flexible. Therefore, the expandable and contractible electronic device is able to expand while bending. Speaking in brief, the electronic device according to one embodiment of the present disclosure is not only "expandable", but also "bendable".

In the electronic device of the present disclosure, connection reliability is increased. Specifically, since the leading electrode film 20 in the electronic device of the present disclosure is disposed over a widely spreading two-dimensional planar region as described above, the leading electrode film 20 can be avoided from giving rise to the problem that "the wire may be disconnected when expanded or contracted, as in the case using the thin metal wire in the related art". In other words, since the leading electrode has the planar form, it can be formed with a sufficiently large width dimension, for example. As a result, disconnection or breakage of the leading electrode is less apt to occur. Furthermore, since the leading electrode film 20 in the electronic device of the present disclosure is uniformly bonded to the "three surfaces in one plane", it is also possible to avoid the problem that "stress generated with expansion or contraction concentrates at the bonded portion as in the case using the metal lead in the related art". Moreover, since the leading electrode film is itself disposed in a uniform state extending in one plane, stress does not excessively concentrate at any point in the leading electrode film, thus providing a structure that disconnection or breakage is less apt to occur with expansion and contraction, bending, etc.

In the electronic device of the present disclosure, as seen from the illustrated embodiment, the electronic elements are themselves arranged without using "surface-mounting packages". Therefore, a high-density array of the electronic elements can be realized. Particularly, while the plural electronic elements are themselves arranged, the conductor is disposed between the electronic elements adjacent to each other. Accordingly, an efficient device configuration with a smaller wasted space can be obtained in the entirety of the electronic device.

Figure 2:
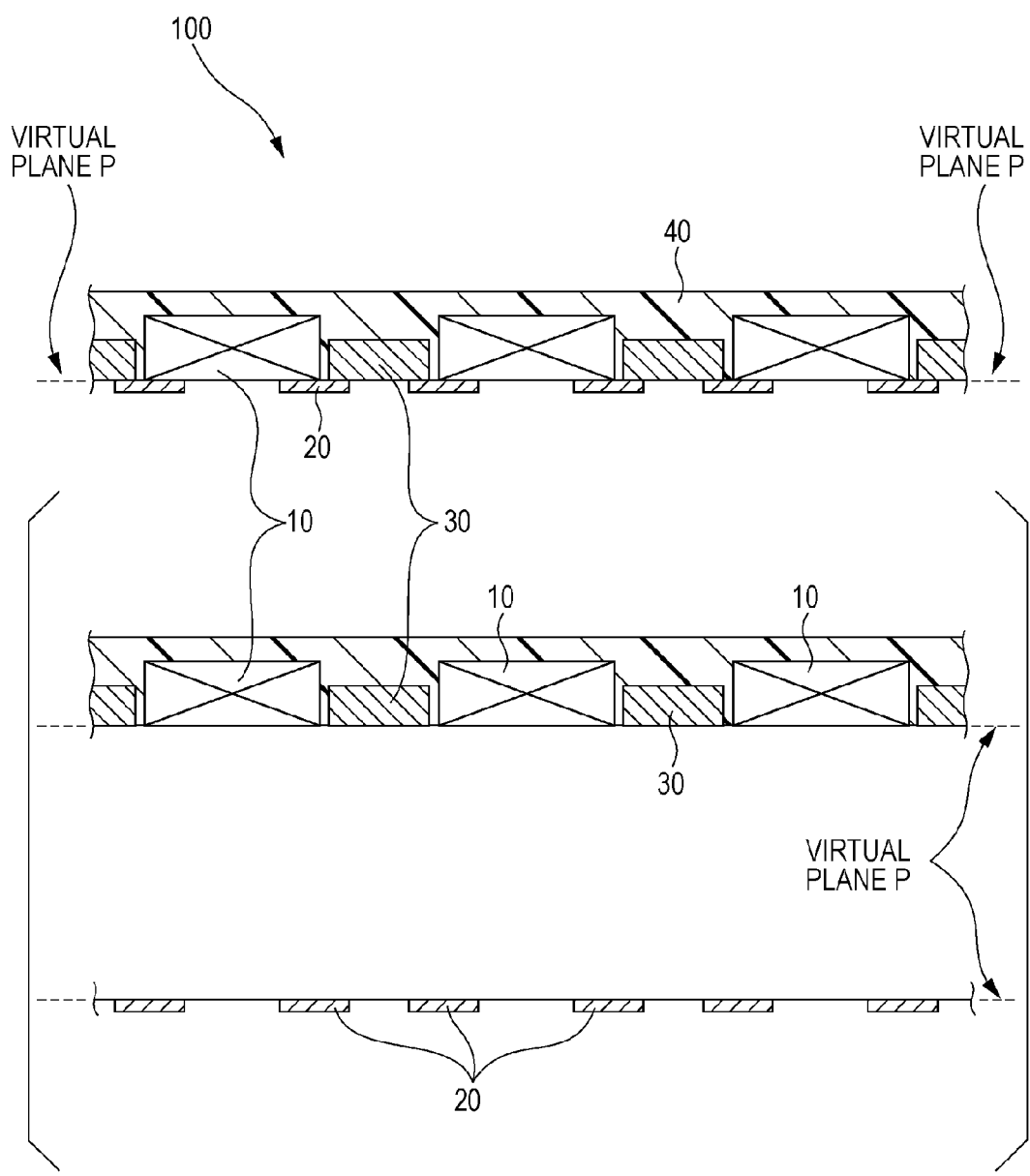
FIG. 2 is a schematic cross sectional view to explain specific features of the electronic device according to an embodiment of the present disclosure.

The featured configuration in the electronic device of the present disclosure is described below. The present disclosure is configured such that various components are arranged on the "same plane". In the electronic device of the present disclosure, as illustrated in FIG. 2, the "electronic elements 10", the "expandable and contractible conductors 30", and the "leading electrode films 20" are disposed on a virtual plane P. More specifically, the plural electronic elements 10 and the plural expandable and contractible conductors 30, which are both covered with the seal 40, are positioned at the upper side of one plane (i.e., of the virtual plane P) (see upper one of the drawings in the parenthesis of FIG. 2). On the other hand, the leading electrode films 20 not covered with the seal 40 are positioned at the lower side of the one plane (i.e., of the virtual plane P) in opposing relation to the electronic elements 10 and the expandable and contractible conductors 30 (see lower one of the drawings in the parenthesis of FIG. 2). Thus, the "electronic elements 10" and the "expandable and contractible conductors 30" are disposed at the upper side of the virtual plane P inside the seal 40, whereas the "leading electrode films 20" are disposed at the lower side of the virtual plane P outside the seal 40. In other words, with the featured configuration described above, the connection reliability is increased in the electronic device of the present disclosure.

The requirements for the individual components in the present disclosure will be described in detail below per component. The "electronic element 10" in the electronic device of the present disclosure is disposed inside the seal 40, but its principal surface A is exposed from the surface of the seal 40 in the state positioned in the same plane. In particular, the plural electronic elements 10 are arrayed along the direction (i.e., the "planar direction") perpendicular to the thickness direction of the device.

The electronic element 10 may be any type of circuit components or circuit elements, which are used in the electronics mounting field. Specific types of the electronic element 10 include, though being merely illustrative, a light emitting element, an IC (e.g., a control IC), an inductor, a semiconductor elements (e.g., a MOS (metal oxide semiconductor)), a capacitor, a power device, a chip resistor, a chip capacitor, a chip varistor, a chip thermistor, a multilayer filter in the chip form, a connection terminal, etc.

When the electronic element 10 is a light emitting element (e.g., an LED), the "exposed principal surface A of the electronic element 10" corresponds to an "active surface of the light emitting element". In more detail, in the case using the light emitting element as the electronic element 10, the active surface of the light emitting element is exposed from the seal 40 in the state positioned in the same plane, and the leading electrode film 20 is connected to a part of the active surface of the light emitting element. Thus, in such an embodiment, the "exposed active surface of the light emitting element", the "exposed surface of the expandable and contractible conductor 30", and the "surface of the seal positioned between the light emitting element and the expandable and contractible conductor" are present in the same plane, and the leading electrode film 20 is bonded to those "three surfaces in one plane" in the state attached thereto in the film-like form.

Figure 4:
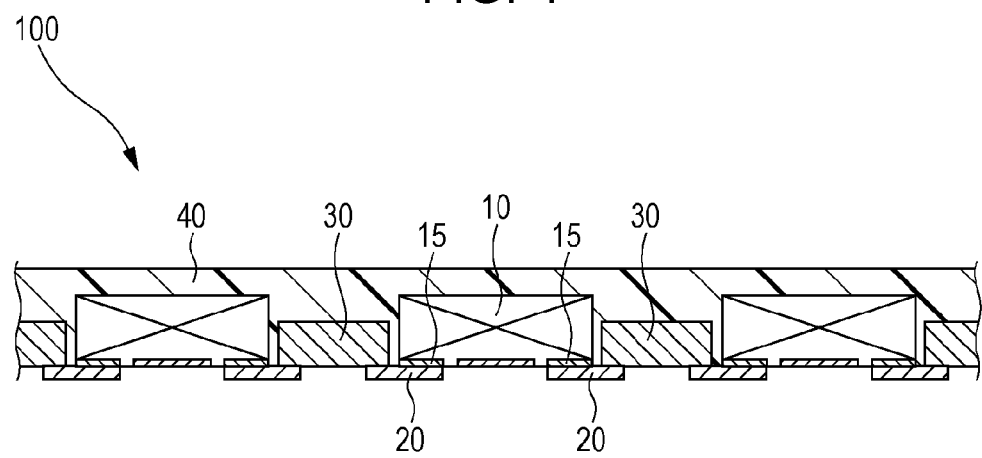
FIG. 4 is a cross sectional view illustrating, in a schematic way, the configuration of the electronic device (e.g. configuration of the electronic device including a light emitting element as an electronic element) an embodiment of according to the present disclosure.

In the case using the light emitting element as the electronic element 10, the active surface of the light emitting element includes element electrodes. Accordingly, in one embodiment, as illustrated in FIG. 4, surfaces of element electrodes 15 of the electronic element 10 are each exposed from the surface of the seal 40 in "the state positioned in the same plane", and the leading electrode film 20 is connected to the exposed element electrode 15. Moreover, in such an embodiment, the surface of the element electrode 15 is present in the same plane as the "exposed surface of the expandable and contractible conductors 30" and the "surface of the seal 40 positioned between the light emitting element and the expandable and contractible conductor", and the leading electrode film 20 is bonded to those "three surfaces in one plane" in the state attached thereto in the film-like form. See FIG. 5 as well, which is referred to in the later description.

The "expandable and contractible conductors 30" in the electronic device of the present disclosure are disposed inside the seal 40 similarly to the electronic elements 10, but its surfaces B are exposed from the surface of the seal 40 in the state positioned in the same plane. For example, when the expandable and contractible conductor has a wide principal surface, the wide principal surface of the expandable and contractible conductor is exposed from the seal in the state positioned in the same plane. On the other hand, when the expandable and contractible conductor does not have a wide principal surface, a part of one surface of the expandable and contractible conductor is exposed from the seal in the state positioned in the same plane. In particular, the plural expandable and contractible conductors 30 are arrayed tow dimensionally along directions (i.e., the "planar direction") perpendicular to the thickness direction of the device such that each expandable and contractible conductor is disposed in a region between the electronic elements 10 adjacent to each other.

The expandable and contractible conductor 30 in the present disclosure may exhibit not only electric conductivity attributable to a material of itself or a conductive material contained therein, but also elasticity attributable to at least one of a three-dimensional form or a material thereof.

Figure 6A:
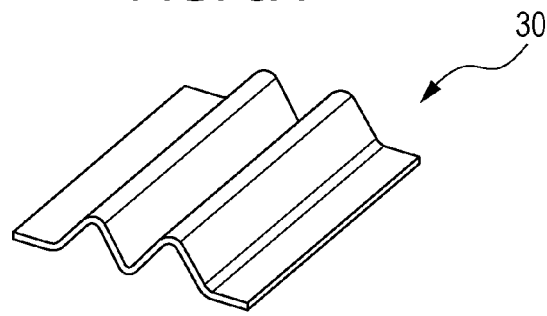
FIGS. 6A, 6B and 6C are perspective views illustrating, in a schematic way, specific examples of an expandable and contractible conductor; specifically.
Figure 6B:
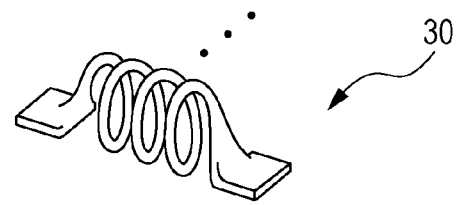
Figure 7:
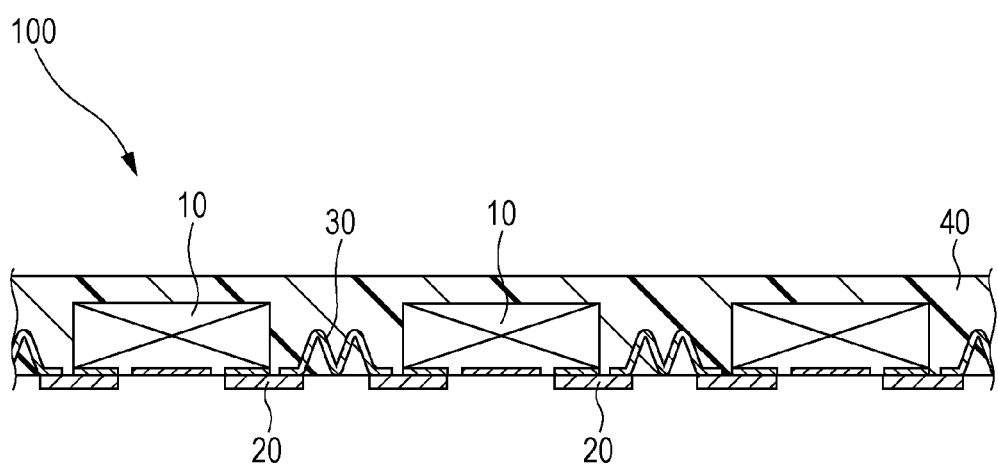
FIG. 7 is a cross sectional view illustrating, in a schematic way, the configuration of the electronic device (i.e., the configuration of the electronic device including a metal-made conductor having a bellows shape) according to an embodiment of the present disclosure.

The expandable and contractible conductor 30 may be, for example, a metal-made conductor having a "bellows shape" or a "spiral shape" (see FIGS. 6A and 6B). In that case, electric conductivity is given attributable to a conductor material "made of a metal", and the elasticity is given attributable to the three-dimensional form such as the "bellows shape" or the "spiral shape". A specific metal material for the expandable and contractible conductor is, e.g., at least one selected from copper, silver, palladium, platinum, and nickel. FIG. 7 illustrates, in a schematic way, an example of the configuration of the electronic device 100 including, as the expandable and contractible conductors 30, the "metal-made conductors having the bellows shape", i.e., the expandable and contractible conductors in the so-called "leaf spring" form.

Figure 6C:
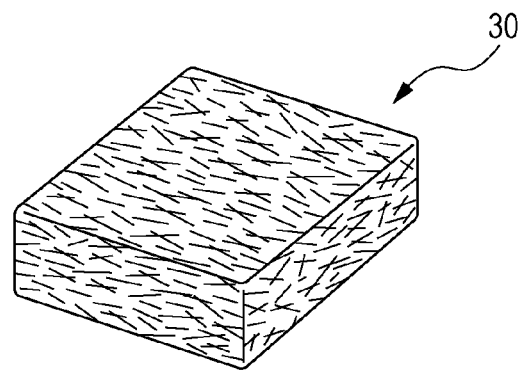

Alternatively, the expandable and contractible conductor 30 may be a rubber-like conductor containing conductive fillers (see FIG. 6C). In that case, the electric conductivity is given attributable to the "contained conductive material" such as the "conductive filler", and the elasticity is given attributable to the conductor material, i.e., the "rubber-like conductor". A base material of the "rubber-like conductor" may be a rubber material. The rubber material may be natural rubber, synthetic rubber, or a mixture of the formers. The rubber material may be, though being merely illustrative, a material containing isoprene rubber, butadiene rubber, chloroprene rubber, styrene/butadiene rubber, or acrylonitrile/butadiene rubber. Alternatively, the base material of the rubber-like conductor may be a "thermoplastic elastomer" having properties of both rubber and plastic. On the other hand, the term "conductive filler" means any suitable type of filler that is added to the rubber-like conductor to give an electrically conductive property. The "conductive filler" may be, e.g., a granular filler, a flaky filler, or fibrous filler each having electric conductivity.

In still another example, the expandable and contractible conductor 30 may be made of a conductive polymer.

The expandable and contractible conductor may have in itself a property being expandable and contractible in a certain direction. More specifically, the expandable and contractible conductor disposed inside the seal may be expandable and contractible in the direction perpendicular to the thickness direction of the seal. There are no particular limitations on dimensions of the expandable and contractible conductor. For example, the expandable and contractible conductor has a smaller thickness than the seal and has such a size in the planar direction as allowing the expandable and contractible conductor to be placed in the region between the electronic elements adjacent to each other.

The "seal 40" in the electronic device of the present disclosure is a seal covering the electronic elements 10 and the expandable and contractible conductors 30 in such a state that their partial surfaces are exposed. The seal 40 is made of, e.g., a resin material. Examples of the resin material for the seal 40 include an epoxy resin, a silicone based resin, a polyimide resin, an acrylic resin, a polyethylene terephthalate resin, a polyethylene naphthalate resin, a polyphenylene sulfide resin, a polyphenylene ether resin, a fluorine based resin such as PTFE, a liquid crystal polymer, and composite materials of any of the formers. As an alternative, the resin material for the seal 40 may be an organic/inorganic hybrid material containing polysiloxane, etc.

There are no particular limitations on the thickness of the seal 40. However, the thickness of the seal 40 is, e.g., about 0.5 mm to 5.0 mm or about 1.2 mm to 1.8 mm.

As described above, the "leading electrode film 20" in the electronic device of the present disclosure is disposed in the state attached to the "exposed principal surface A of the electronic element 10", the "exposed surface B of the expandable and contractible conductor 30", and the "surface C of the seal 40 positioned between the electronic element and the expandable and contractible conductor 30". Regarding the attached state of the leading electrode film 20, see FIGS. 1 and 5 as well.

Figure 5:
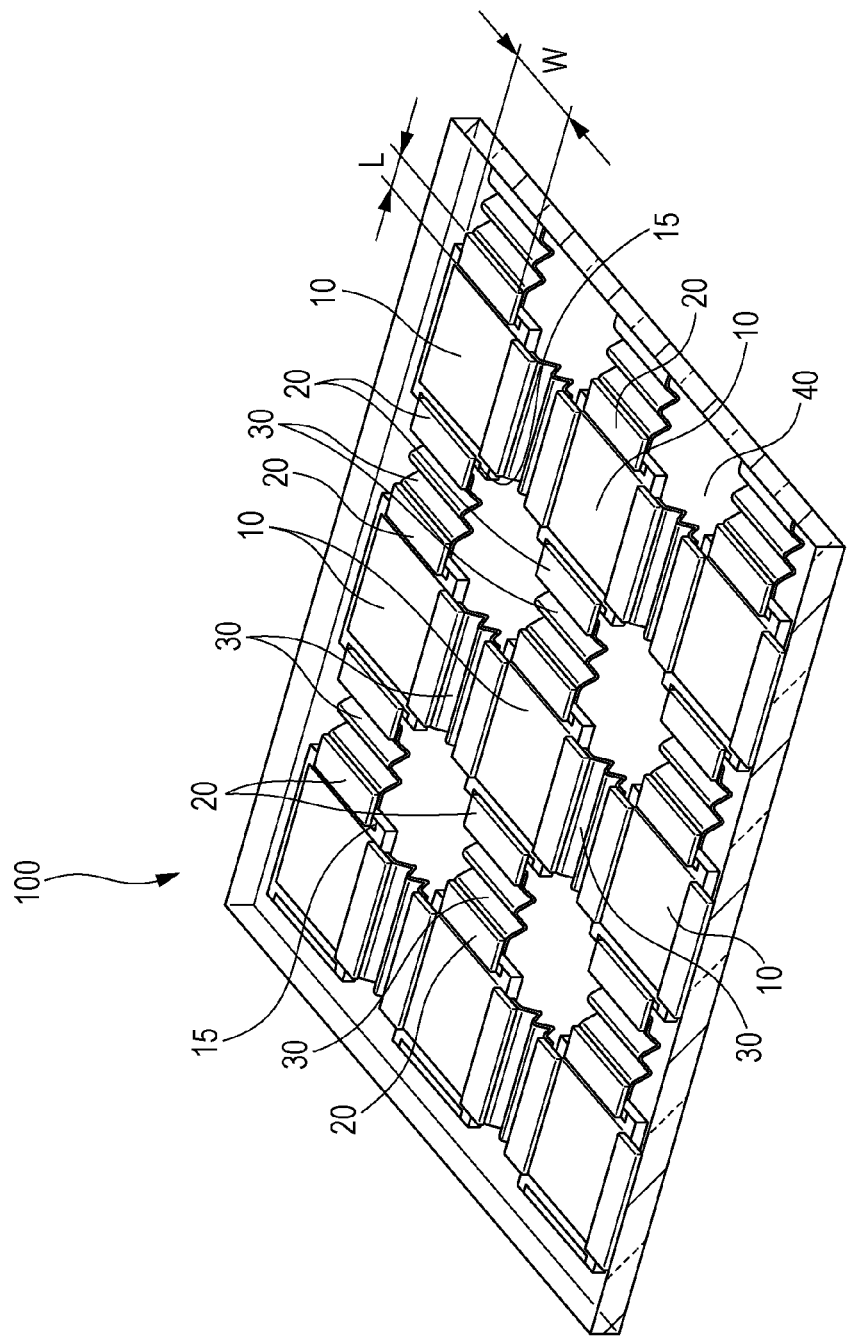
FIG. 5 is a seeing-through perspective view illustrating, in a schematic way, the configuration of the electronic device according to an embodiment of the present disclosure (i.e., a perspective view illustrating a seal as transparent such that various elements of the electronic device can be seen from the outside).

As clearly seen from the embodiment illustrated in FIG. 5, since the leading electrode film 20 is in the "state attached in the film-like form" to the three surfaces, the leading electrode film 20 may be disposed, for example, to extend in a fashion intersecting a large part of an outer periphery (peripheral edge) of the electronic element 10. Specifically, looking at one side of the outer periphery of the electronic element 10, the leading electrode film 20 may be disposed to extend at such a large width dimension as intersecting, e.g., 50% or more, 60% or more, or 70% or more of the length of the one side.

Because the leading electrode film 20 is in the "form of a film", the thickness of the leading electrode film 20 is comparatively thin and may be, e.g., about 1 to 500 µm, about 5 to 250 µm, or about 20 to 100 µm. Furthermore, because the leading electrode film 20 is in the "form of a film", the width and extension dimensions of the leading electrode film 20 are comparatively large. For example, the width dimension W of the leading electrode film illustrated in FIG. 5 may be, e.g., about 0.05 to 10 mm or about 0.1 to 1 mm, and the extension dimension L of the leading electrode film illustrated in FIG. 5 may be, e.g., about 25 to 1000 µm or about 50 to 300 µm.

There are no particular limitations on a material of the leading electrode film 20. For example, a main component of the material is metal. At least one metal material selected from copper (Cu), silver (Ag), palladium (Pd), platinum (Pt), and nickel (Ni), for example, can be used as a main material of the leading electrode film 20. In the electronic device of the present disclosure, the leading electrode film 20 can also function as a heat dissipater. Since the leading electrode film 20 is in the widely spreading two-dimensional planar form, it is particularly suitable for efficiently dissipating heat due to the specific shape. When the leading electrode film 20 serves as the heat dissipater, at least part of heat generated from the electronic element 10 is dissipated through the leading electrode film 20.

In the case of placing importance particularly on the above-described "heat dissipation characteristics", the leading electrode film may be made of a metal material having higher thermal conductivity than a solder, for example. In other words, when the thermal conductivity of a solder is about 45 to about 85 W/mK, a metal having higher thermal conductivity than that of the solder may be used as the material of the leading electrode film. One example of the metal material having so high thermal conductivity is copper (Cu). Thus, the leading electrode film may be made of copper.

Figure 8:
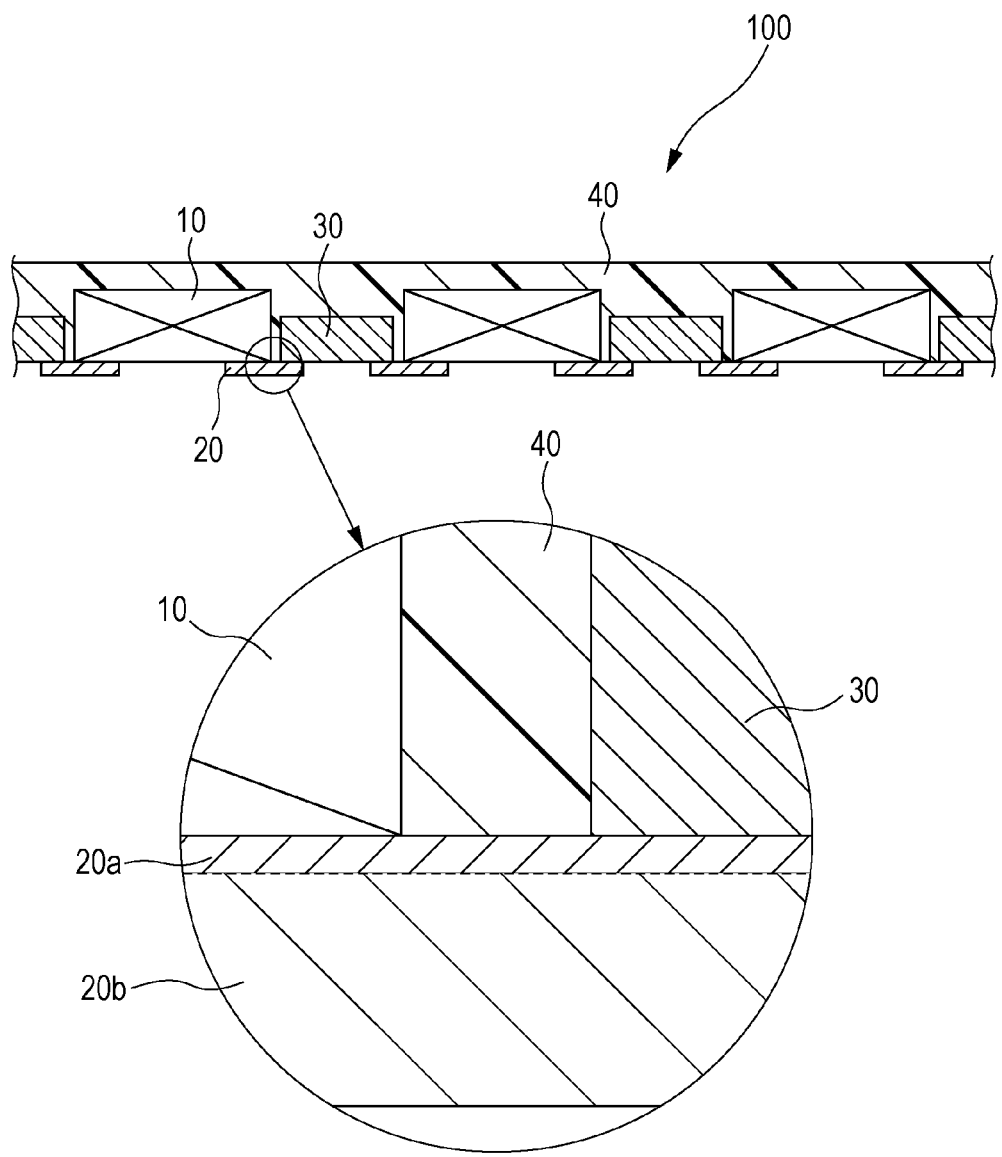
FIG. 8 is a cross sectional view illustrating, in a schematic way, the configuration of the electronic device (i.e., the configuration of the electronic device in which a leading electrode film has a double-layer structure made of a dry plating layer and a wet plating layer) according to an embodiment of the present disclosure.

In one embodiment, the leading electrode film 20 in the present disclosure has a double-layer structure of a "dry plating layer" and a "wet plating layer". More specifically, as illustrated in FIG. 8, the "dry plating layer 20a" is disposed to be directly connected to a part of the electronic element 10, and the "wet plating layer 20b" is disposed over the dry plating layer 20a. Stated in another way, the dry plating layer 20a is disposed at the more proximal side relative to the electronic element 10 or the expandable and contractible conductor 30, whereas the wet plating layer 20b is disposed at the more distal side relative to the electronic element 10 or the expandable and contractible conductor 30.

The "dry plating layer" is a layer formed by the dry plating method. Specific examples of the dry plating method are the physical vapor deposition (PVD) method (or vacuum coating method) and the chemical vapor deposition (CVD) method. The physical vapor deposition (PVD) method includes, e.g., vacuum vapor deposition, sputtering, and ion plating. On the other hand, the "wet plating layer" is a layer formed by the wet plating method. A specific example of the wet plating method is the electroplating method (e.g., the electrolytic plating). The dry plating layer 20a may contain at least one type of metal material selected from Ti (titanium), Cr (chromium), and Ni (nickel), for example. The thickness of the dry plating layer 20a is, e.g., 100 nm to 500 nm. On the other hand, the wet plating layer 20b may contain at least one type of metal material selected from Cu (copper) and Al (aluminum), for example. The thickness of the wet plating layer 20b is, e.g., 10 µm to 500 µm. Thus, the dry plating layer 20a is very thin, whereas the wet plating layer 20b may be thick. The dry plating layer 20a is not limited to a single layer, and it may be formed as a plurality of layers. For example, the dry plating layer may include a Ti thin-film layer and a Cu thin-film layer.

More specific embodiments and modifications of the electronic device of the present disclosure will be described below.

First Embodiment

FIG. 5 illustrates a specific embodiment of the electronic device 100 of the present disclosure. In the illustrated embodiment, the plural electronic elements 10 are arranged in an array. Stated in another way, the plural electronic elements 10 are regularly arranged in the two-dimensional planar direction. The expression "arranged in an array" used here implies that the plural electronic elements 10 are regularly arranged in the two-dimensional planar direction at constant intervals. Stated in another way, the expression "the plural electronic elements are arranged in an array" substantially implies that the plural electronic elements 10 are regularly arranged in a two-dimensional planar pattern. In one embodiment of the present disclosure, the plural electronic elements are regularly arranged on the same plane at the same level.

When the plural electronic elements 10 are arranged in an array, the "expandable and contractible conductors 30", each arranged between the electronic elements adjacent to each other, may also be arranged in an array. Thus, as seen from the embodiment illustrated in FIG. 5, the expandable and contractible conductors 30 may also be regularly arranged, for example, in the two-dimensional planar direction at constant intervals. Furthermore, because the leading electrode films 20 are bonded to the electronic elements 10 and the expandable and contractible conductors 30 both arranged as described above, the "leading electrode films 20" may also be arranged in an array, for example. Thus, the leading electrode films 20 may also be regularly arranged in the two-dimensional planar direction at constant intervals in a similar way.

In one embodiment of the present disclosure, as described above, the plural "electronic elements", the plural "expandable and contractible conductors", and the plural "leading electrode films" are regularly arranged in the planar direction at constant intervals. The arrangement of the expandable and contractible conductors in the planar direction implies that wirings can be independently led out in two directions. As a result, matrix wiring can be practiced. Furthermore, when the expandable and contractible conductors 30 are arranged to lie in, e.g., an oblique direction in addition to the two directions of "length and width" (in this case, the electronic elements are arranged in an array of a "hexagonal shape"), wirings can be independently led out in three directions (such leading-out of the wirings can be used for, e.g., power supply through power lines). Moreover, when the electronic elements are arranged in an array of an "octagonal shape", wirings can be independently led out in four directions.

Figure 9:
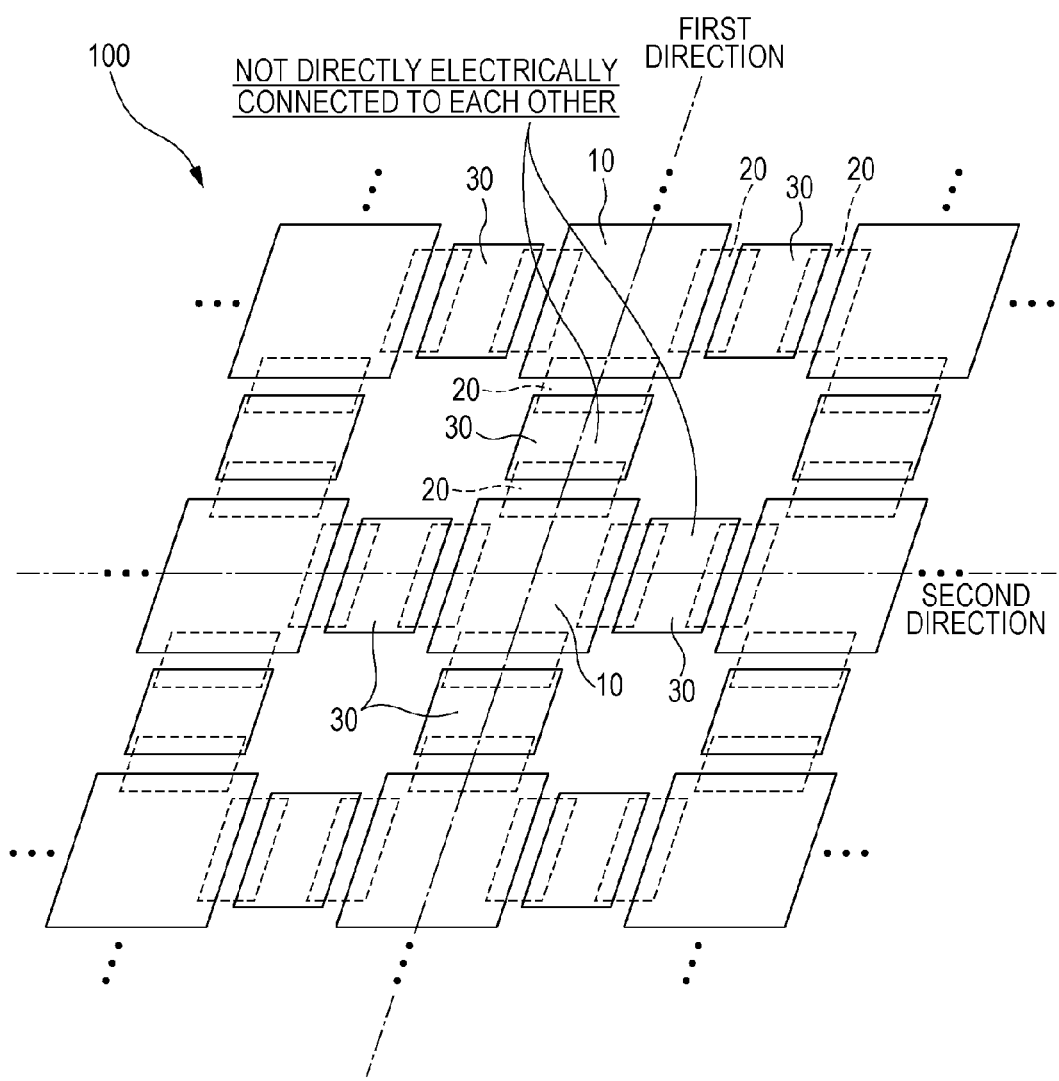
FIG. 9 is a schematic view illustrating an embodiment in which the electronic elements, the expandable and contractible conductors, and the leading electrode films are arrayed along a first direction and a second direction.

To explain in more detail the embodiment illustrated in FIG. 5, the expandable and contractible conductors 30 arranged along one direction may not be directly electrically connected to the other expandable and contractible conductors 30 arranged along another direction. More specifically, as illustrated in FIG. 9, the plural electronic elements 10 are arrayed along a first direction and a second direction such that two of the electronic elements 10 adjacent to each other in the first direction and the expandable and contractible conductor 30 arranged between those adjacent electronic elements 10 are electrically connected through two of the leading electrode films 20 arranged along the first direction. The electronic elements 10 adjacent to each other in the second direction and the expandable and contractible conductor 30 arranged between those adjacent electronic elements 10 are electrically connected through two of the leading electrode films 20 arranged along the second direction. In this case, the "expandable and contractible conductors 30 arranged along the first direction" and the "expandable and contractible conductors 30 arranged along the second direction" may not be directly electrically connected to each other. In that embodiment, each line of the electronic elements 10 arranged along the first direction and each line of the electronic elements 10 arranged along the second direction can be controlled independently, and an electronic device having a higher degree of freedom in design can be realized. The "first direction" and the "second direction" form an angle of 45° to 90° therebetween in the two-dimensional planar direction. In the illustrated embodiment, the "first direction" and the "second direction" form an angle of about 90°.

Second Embodiment

Figure 10A:
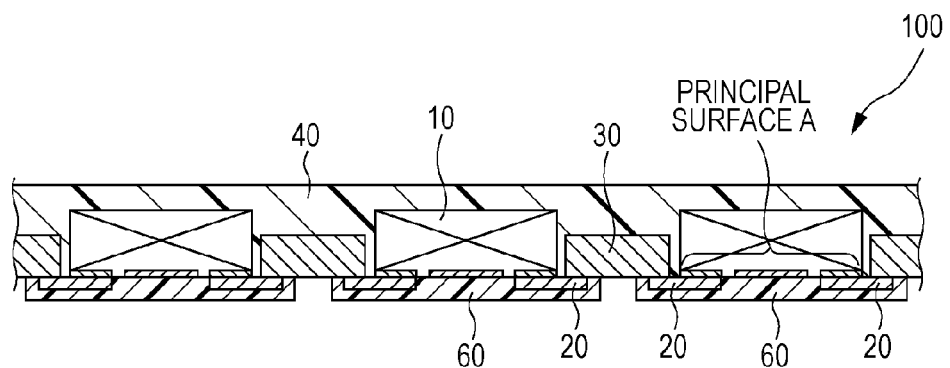
FIGS. 10A and 10B are respectively a cross sectional view and a seeing-through perspective view illustrating, in a schematic way, the configuration of the electronic device (i.e., the configuration of the electronic device additionally including a "reinforcement film") according to an embodiment of the present disclosure.
Figure 10B:
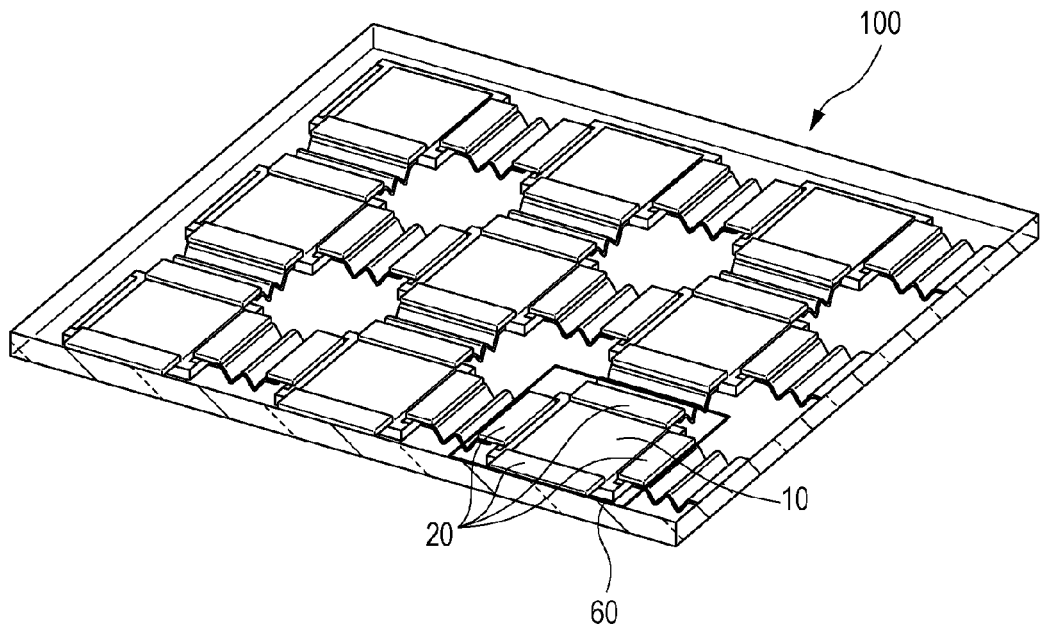

FIGS. 10A and 10B illustrate one modified embodiment of the electronic device 100 of the present disclosure. In this embodiment, at least one reinforcement film 60 is additionally disposed. More specifically, the reinforcement film 60 is disposed in a state entirely covering the "exposed principal surface A of the electronic element 10" and the "leading electrode films 20" attached to the former. In other words, as seen from the illustrated embodiment, the reinforcement film 60 may be disposed over a widely spreading two-dimensional planar region, for example, such that the "exposed principal surface A of the electronic element 10" and "the leading electrode films 20" attached to the former are shielded by the reinforcement film 60 (see particularly both FIGS. 10A and 10B)). With the provision of the reinforcement film 60, it is possible to not only directly reinforce the leading electrode films 20, but also to reinforce connected portions of the leading electrode films 20. As a result, disconnection or breakage in association with the leading electrode films 20 can be avoided. A plurality of reinforcement films 60 may be provided to cover all the principal surfaces of the electronic elements 10 and all the leading electrode films 20.

In this specification, the term "reinforcement", i.e., the "reinforcement film", is used in consideration of that the reinforcement film supports the leading electrode films and their connected portions from the structural point of view for preventing the occurrence of breakage, for example.

The thickness (in a portion where the leading electrode film 20 is not present) of the reinforcement film 60 may be, e.g., about 5 to 500 μm or about 25 to 250 μm. There are no particular limitations on a material of the reinforcement film insofar as the material is suitable for the reinforcement in the above-described sense. The reinforcement film may be made of a resin material, for example. In particular, taking into account that the electronic device is to be expandable and contractible, the reinforcement film may be made of a resin material having at least one of elasticity and flexibility (for example, the reinforcement film may be, though being merely illustrative, a film made of polyimide).

Third Embodiment

Figure 11:
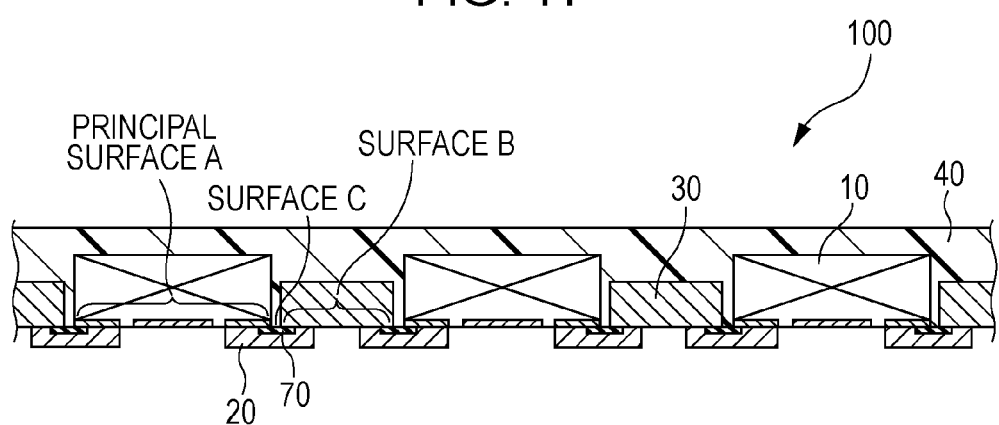
FIG. 11 is a cross sectional view illustrating, in a schematic way, the configuration of the electronic device (i.e., the configuration of the electronic device additionally including an "insulator") according to an embodiment of the present disclosure.

FIG. 11 illustrates another modified embodiment of the electronic device 100 of the present disclosure. In this embodiment, at least one insulator 70 is additionally disposed. More specifically, the insulator 70 is positioned inside or at the inner side of the leading electrode film 20 and is disposed in contact with the three surfaces, i.e., the "exposed principal surface A of the electronic element 10", the "exposed surface B of the expandable and contractible conductor 30", and the "surface C of the seal 40 positioned between the electronic element 10 and the expandable and contractible conductor 30". Thus, as seen from the illustrated embodiment, the insulator 70 may be disposed in a form locally bridging an edge portion of the electronic element and an edge portion of the expandable and contractible conductor in a region where the leading electrode film is bonded to the electronic element 10 and the expandable and contractible conductor 30.

With the provision of the insulator 70, generation of short-circuiting can be effectively prevented in a region where edge short-circuiting may occur. Moreover, as seen from the layout form of the insulator 70, the insulator can additionally serve to reinforce the leading electrode film as with the "reinforcement film 60". Although a level difference is generated in the leading electrode film corresponding to the thickness of the insulator, concentration of stress during expansion or contraction of the device is suppressed because an integral member of the insulator 70 and the leading electrode film 20 is formed in contact with the "three surfaces in one plane"

defined by the electronic element 10, the seal 40, and the expandable and contractible conductor 30.

The thickness of the insulator 70 may be, e.g., about 1 to 50 μm or about 2 to 10 μm. There are no particular limitations on a material of the insulator 70 insofar as the insulator exhibits insulation performance. The material of the insulator may be resin, for example. The resin may be, e.g., an epoxy based resin or a silicone based resin. In consideration of light stability and heat resistance, the insulator may be made of an organic-inorganic hybrid material or an inorganic material. The insulator 70 may be, though being merely illustrative, a silicone oxide film or a silicon nitride layer. A plurality of insulators 70 may be provided corresponding to all the leading electrode films 20.

Fourth Embodiment

Figure 12:
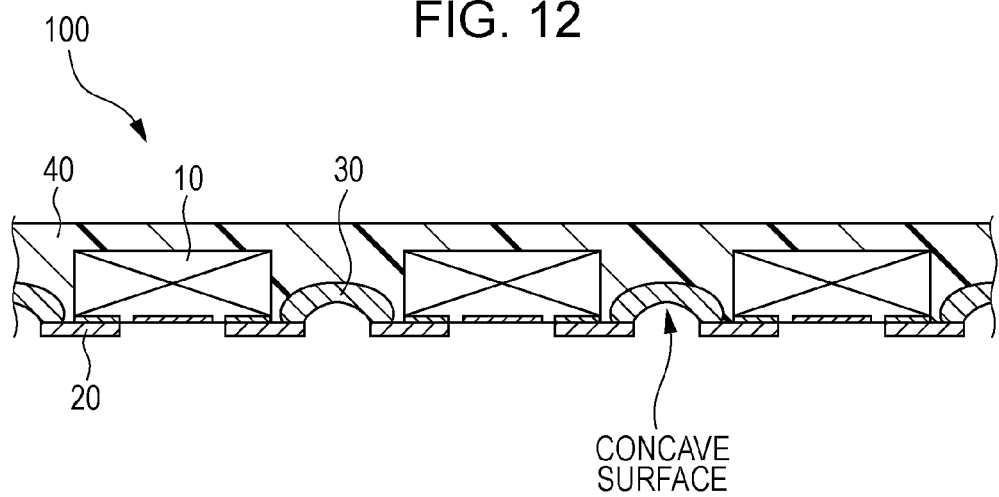
FIG. 12 is a cross sectional view illustrating, in a schematic way, the configuration of the electronic device (i.e., the configuration of the electronic device in which the expandable and contractible conductor has a concave shape) according to an embodiment of the present disclosure.

FIG. 12 illustrates still another modified embodiment of the electronic device 100 of the present disclosure. In this embodiment, at least one of the expandable and contractible conductors 30 has a concave shape in its entirety. More specifically, the expandable and contractible conductor 30 may have a concave shape, and a "concave surface of the expandable and contractible conductor", which is defined by the concave shape, may be exposed from the seal 40. In other words, an exposed-side surface of the expandable and contractible conductor 30 may have a form recessing toward the inside of the seal 40. In such an embodiment, ends of the expandable and contractible conductor 30 are present in the same plane as the "surface of the seal". Thus, the leading electrode films 20 may be bonded to those ends of the expandable and contractible conductor 30, which are present in the same plane as the "surface of the seal".

With the expandable and contractible conductor 30 having the concave shape as described above, more appropriate expandable/contractible characteristics can be given to the electronic device. The electronic device of the present disclosure can be more easily given with, e.g., characteristics enabling the device to be expanded while allowing bending thereof. All of the expandable and contractible conductors 30 may have the concave shape.

(Manufacturing Method for Electronic Device of Present Disclosure)

A manufacturing method for the electronic device of the present disclosure will be described below. FIGS. 13A to 13D illustrate, in a schematic way, a manufacturing process according to the present disclosure. When carrying out the manufacturing method of the present disclosure, the plural electronic elements 10 and the plural expandable and contractible conductors 30, each to be positioned between the electronic elements adjacent to each other, are first placed on an adhesive sheet 80 in step (i). In other words, the electronic elements 10 and the expandable and contractible conductors 30 are arranged in the two-dimensional planar form in a state stuck to the adhesive sheet 80 (see FIG. 13A).

Figure 13A:
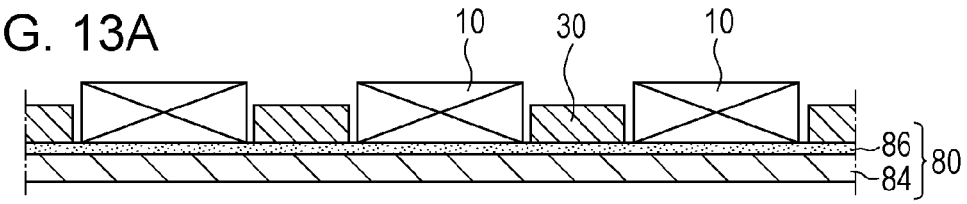
FIGS. 13A to 13D are cross sectional views illustrating, in a schematic way, successive steps of a manufacturing method according to an embodiment of the present disclosure.

The adhesive sheet 80 may be, e.g., a carrier sheet made up of a base material and an adhesive layer. Specifically, as illustrated in FIG. 13A, the adhesive sheet 80 may be a carrier sheet having a double-layer structure in which an adhesive layer 86 is disposed on a support base material 84. Taking into account a separation process to be carried out later, the support base material 84 may have flexibility.

The support base material 84 may be any type of sheet-like material insofar as the sheet-like material will not impede processes, carried out later, of "arranging the electronic elements and the expandable and contractible conductors" and "forming the seal". A material of the support base material 84 may be resin, metal, and/or ceramic. The resin as the material of the support base material 84 may be, e.g., a polyester resin such as polyethylene terephthalate or polyethylene naphthalate, an acrylic resin such as polymethacrylic acid methyl, a polycycloolefin resin, or polycarbonate. The metal as the material of the support base material 84 may be, e.g., iron, copper, aluminum, or one of alloys of the formers (one typical example is stainless steel such as SUS). The ceramic as the material of the support base material 84 may be, e.g., apatite, alumina, silica, silicon carbide, silicon nitride, or boron carbide. The thickness of the support base material 84, which is in the "form of a sheet", may be, e.g., 0.1 mm to 2.0 mm or 0.2 mm to 1.0 mm (0.2 mm in one example).

There are no particular limitations on a material of the adhesive layer 86 insofar as the material has adhesivity with respect to the electronic element and the expandable and contractible conductor. The adhesive layer 86 may contain, e.g., at least one type of adhesive material selected from an acrylic resin based adhesive, a urethane resin based adhesive, a silicone resin based adhesive, and an epoxy resin based adhesive. The thickness of the adhesive layer 86 may be, e.g., 2 μm to 50 μm or 5 μm to 20 μm (about 10 μm in one example). Furthermore, the adhesive layer 86 may be a double faced adhesive tape (e.g., a tape formed by coating adhesive layers on both principal surfaces of a resin thin layer made of a PET film, for example).

Regarding arrangement of the electronic elements 10 and the expandable and contractible conductors 30, after arranging the plural electronic element 10 on the adhesive sheet 80, the expandable and contractible conductors 30 may be each disposed in a region between the electronic elements 10 adjacent to each other. Alternatively, in a manner reversed to the above example, after arranging the plural expandable and contractible conductors 30 on the adhesive sheet 80, the plural electronic elements 10 may be disposed at positions where two adjacent electronic elements sandwich one of the expandable and contractible conductors 30.

The expandable and contractible conductors 30 disposed on the adhesive sheet 80 in step (i) may exhibit not only electric conductivity attributable to a material of itself or a conductive material contained therein, but also elasticity attributable to at least one of a three-dimensional form or a material thereof. The expandable and contractible conductor may be, for example, the metal-made conductor having the "bellows shape" or the "spiral shape" (see FIGS. 6A and 6B). As an alternative, the expandable and contractible conductor may be the rubber-like conductor containing the conductive fillers (see FIG. 6C). The expandable and contractible conductor may be disposed on the adhesive sheet 80 not in a state where an external force acting to expand the conductor is applied, but in a state where such an external force is released.

Figure 13B:
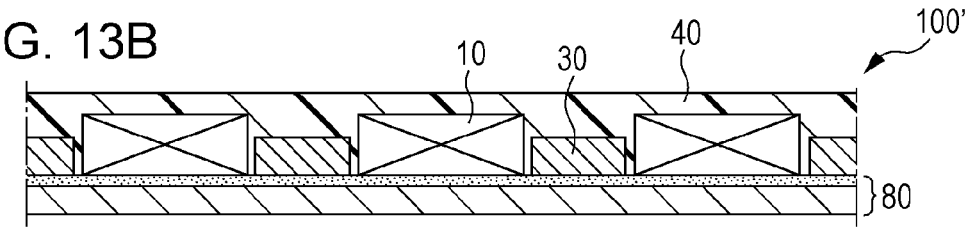

Step (ii) is carried out subsequent to step (i). Specifically, as illustrated in FIG. 13B, the seal 40 is formed over the adhesive sheet 80 to cover the electronic elements 10 and the expandable and contractible conductors 30, whereby an electronic device precursor 100' is obtained.

The seal 40 can be disposed by applying a resin material over an adhesive surface of the adhesive sheet 80 with the spin coating method or the doctor blade method, for example, and then by subjecting the applied resin material to, e.g., heat treatment or light irradiation (i.e., by thermally or optically curing the applied resin material to form the seal 40). Alternatively, the seal 40 may be disposed by bonding, e.g., a resin film to the adhesive surface of the adhesive sheet 80 with another method. Moreover, the seal 40 may be disposed by filling a powdery or liquid sealing resin, which is in a non-cured state, into a die, and by thermally curing the filled sealing resin.

The seal 40 may be made of any type of material insofar as the material exhibits insulation performance. Examples of the material for the seal 40 include an epoxy resin, a silicone based resin, a polyimide resin, an acrylic resin, a polyethylene terephthalate resin, a polyethylene naphthalate resin, a polyphenylene sulfide resin, a polyphenylene ether resin, a fluorine based resin such as PTFE, a liquid crystal polymer, and composite materials of the formers. The thickness of the seal 40 may be, e.g., about 0.5 mm to 5.0 mm or about 1.2 mm to 1.8 mm.

Step (iii) is carried out subsequent to step (ii). Specifically, as illustrated in FIG. 13C, the adhesive sheet 80 is separated from the electronic device precursor 100', thus making the principal surfaces of the electronic elements 10 and the surfaces of the expandable and contractible conductors 30 exposed from the surface of the seal 40.

Figure 13C:
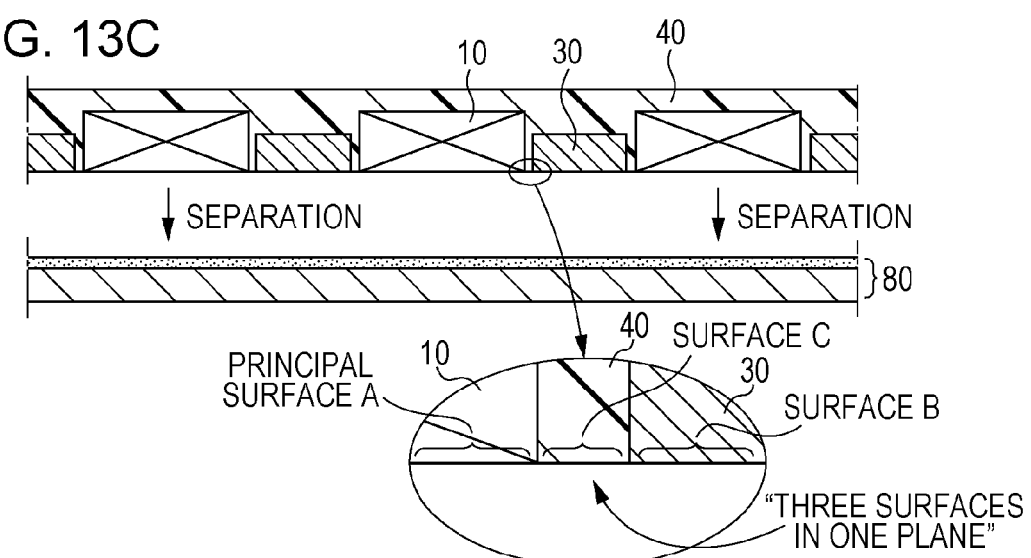

With the step (iii), the "principal surface A of each electronic element 10 exposed from the seal 40", the "surface B of each expandable and contractible conductor 30 exposed from the seal 40", and the "surface C of the seal 40 positioned between the electronic element 10 and the expandable and contractible conductor 30" are positioned in the same plane (see the enlarged drawing in FIG. 13C). In other words, the "three surfaces in one plane" can be obtained with the separation of the adhesive sheet 80 in step (iii).

Figure 13D:
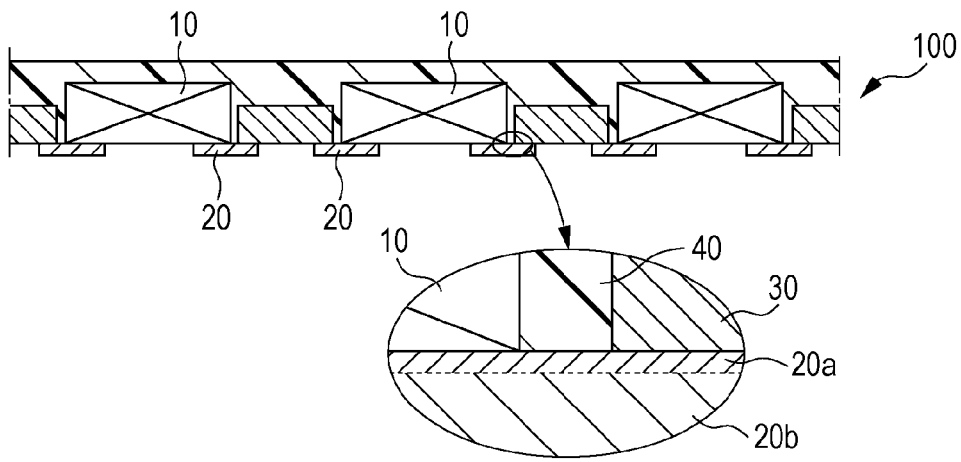

Step (iv) is carried out subsequent to step (iii). Specifically, as illustrated in FIG. 13D, the leading electrode films 20 are formed such that the leading electrode films are connected to parts of the principal surfaces of the electronic elements 10.

In step (iv), the leading electrode film 20 is formed in the state attached in the film-like form to the three surfaces, i.e., the "exposed principal surface A of the electronic element 10", the "exposed surface B of the expandable and contractible conductor 30", and the "surface C of the seal 40 positioned between the electronic element 10 and the expandable and contractible conductor 30".

The leading electrode film 20 may be formed by a metal plating process. In other words, the leading electrode film 20 may be obtained by performing a metal plating process on the "exposed principal surface A of the electronic element 10", the "exposed surface B of the expandable and contractible conductor 30", and the "surface C of the seal 40 positioned between the electronic element and the expandable and contractible conductor".

In one embodiment, the leading electrode film 20 is formed by performing the dry plating method on the plane where the "three surfaces in one plane" are present, and then by performing the wet plating method.

The above-mentioned metal plating process has such a process feature that "the leading electrode film is directly formed on the 'three surfaces in one plane'". The leading electrode film 20 may be formed in a large thickness as required. Therefore, the leading electrode film 20 can also be used as a "heat dissipater", for example. Looking at the feature of the manufacturing process, it can be said that, since the dry plating method is first performed, a plating layer can be formed in a comparatively large thickness with a high adhesive force by the wet plating method that is performed later.

The dry plating method includes the physical vapor deposition (PVD) method (or vacuum coating method) and the chemical vapor deposition (CVD) method. The physical vapor deposition (PVD) method includes, e.g., sputtering, vacuum vapor deposition, and ion plating. On the other hand, the wet plating method includes the electroplating method (e.g., the electrolytic plating), the chemical plating method, and hot dipping. In one embodiment, the manufacturing method of the present disclosure may be practiced by performing the sputtering as the dry plating method, and by performing the electroplating method (e.g., the electrolytic plating) as the wet plating method.

For example, the dry plating layer 20a may be formed in a thickness of 100 nm to 500 nm by performing the dry plating method, and the wet plating layer 20b may be formed in a thickness of 10 μm to 500 μm over the dry plating layer 20a by performing the wet plating method (see an enlarged drawing in FIG. 13D). Thus, the leading electrode film 20 can be formed such that the dry plating layer 20a is very thin, whereas the wet plating layer 20b is relatively thick.

The dry plating layer 20a formed by the dry plating method may contain at least one type of metal material selected from Ti (titanium), Cr (chromium), and Ni (nickel), for example. On the other hand, the wet plating layer 20b formed by the wet plating method may contain at least one type of metal material selected from Cu (copper), Ni (nickel), and Al (aluminum), for example.

The dry plating layer 20a is not limited to a single layer and, though being merely illustrative, it may be formed as a plurality of layers. For example, the dry plating layer 20a may be made up of a Ti thin-film layer and a Cu thin-film layer, which are formed by sputtering (more specifically, the Cu thin-film layer may be formed after forming the Ti thin-film layer). In that case, a thick Cu plating layer may be formed as the wet plating layer 20b by electrolytic plating over the sputtering layer of such a double-layer structure.

A patterning process may be carried out on the plating layers formed by the metal plating process, such as the dry plating method and the wet plating method, to obtain the desired two-dimensional planar form. Specifically, the leading electrode film 20 can be obtained in the state contacting with the three surfaces, i.e., the "exposed principal surface A of the electronic element 10", the "exposed surface B of the expandable and contractible conductor 30", and the "surface C of the seal 40 positioned between the electronic element 10 and the expandable and contractible conductor 30", by carrying out the patterning process on the metal plating layers that have been formed by the plating process. In other words, the leading electrode films 20 in the desired form can be obtained with the patterning process. There are no particular limitations on the patterning process itself. The patterning process may be one that is usually practiced in the electronics mounting field. For example, the desired patterning process may be carried out by utilizing photolithography that is performed through steps of resist formation, exposure and development, etching, etc.

The electronic device 100, illustrated in FIG. 13D, can be finally obtained through the above-described steps.

The case using a light emitting element (e.g., an LED) as the electronic element 10 is described below as one example. In that case, the electronic elements 10 may be arranged in step (i) such that an active surface (more specifically, element electrodes) of each light emitting element is contacted with the adhesive sheet. With that arrangement, the active surface (more specifically, the element electrodes) of each light emitting element is made exposed from the seal by separating the adhesive sheet in step (iii). In step (iv), therefore, the leading electrode film may be formed to be connected to the element electrode (e.g., a cathode or anode electrode), which is a part of the active surface of the light emitting element.

The manufacturing method of the present disclosure can be practiced in various process modes. Those process modes will be described below.

Fifth Embodiment

A fifth embodiment corresponds to a method for manufacturing the electronic device according to the first embodiment.

According to the fifth embodiment, in step (i), the plural electronic elements 10 are placed in an array on the adhesive sheet 80. In other words, the plural electronic elements 10 are regularly arranged in the two-dimensional planar direction at constant intervals in a state stuck to the adhesive sheet 80. This substantially implies that the plural electronic elements 10 are regularly stuck to the adhesive sheet in the two-dimensional planar direction.

When arranging the plural electronic elements 10 in an array in step (i), the "expandable and contractible conductors 30", each to be positioned between the electronic elements adjacent to each other, may also be arranged in an array as with the electronic elements. Stated in another way, in step (i), the expandable and contractible conductors 30 may also be regularly arranged in the two-dimensional planar direction in a state stuck to the adhesive sheet 80.

Figure 14A:
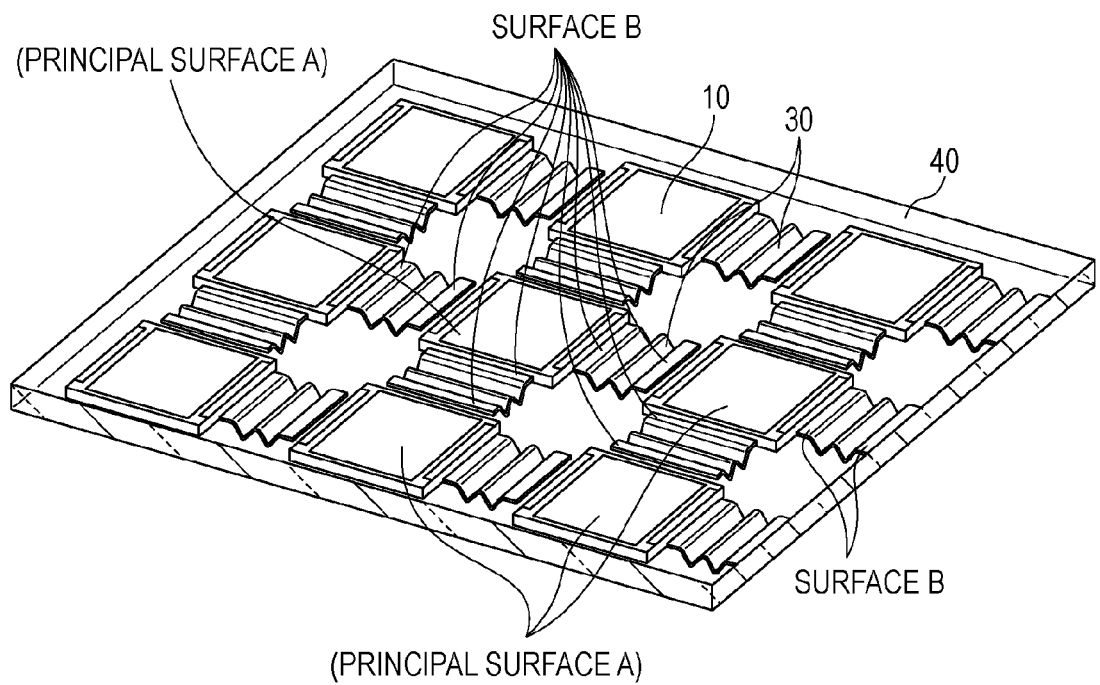
FIG. 14A is a seeing-through perspective view of an electronic device precursor, the view illustrating the state "after separating an adhesive sheet".

By arranging the electronic elements 10 and the expandable and contractible conductors 30 on the adhesive sheet 80 as described above, the "principal surfaces A of the electronic elements 10" and the "surfaces B of the expandable and contractible conductors 30" are made exposed in an array from the seal 40 by separating the adhesive sheet in step (iii) (see FIG. 14A).

Figure 14B:
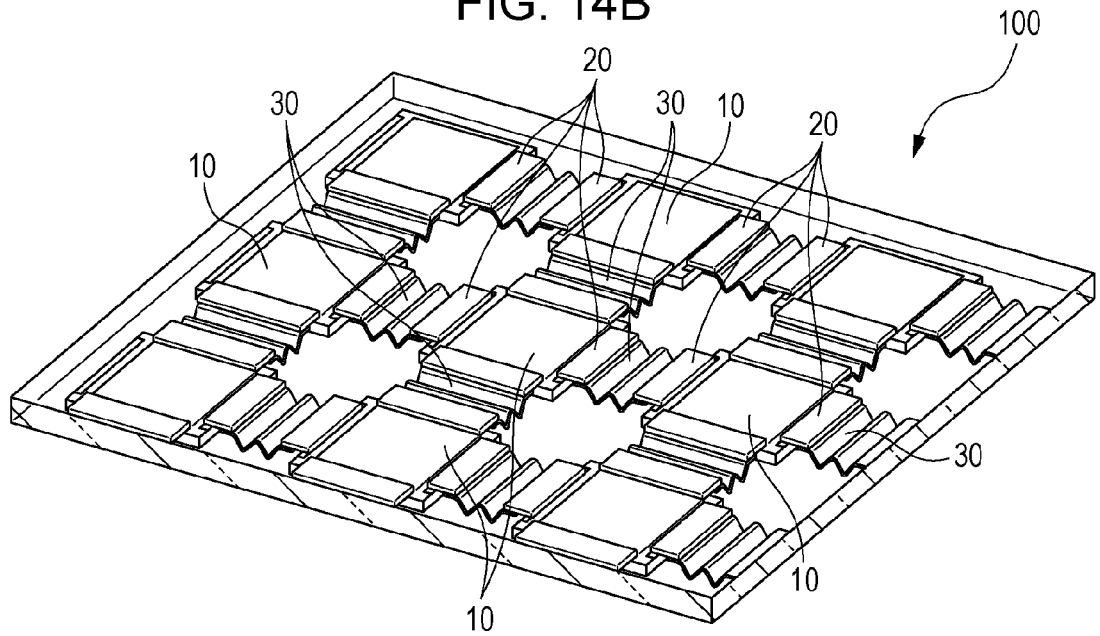
FIG. 14B is a seeing-through perspective view of the electronic device, the view illustrating the state "after forming the leading electrode films".
Figure 15A:
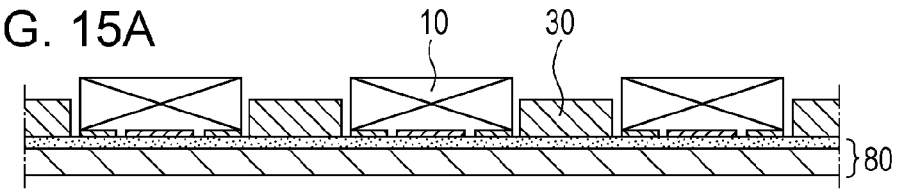
FIGS. 15A to 15E are cross sectional views illustrating, in a schematic way, successive steps of the manufacturing method (i.e., an embodiment of additionally providing the reinforcement film) according to an embodiment of the present disclosure.
Figure 15B:
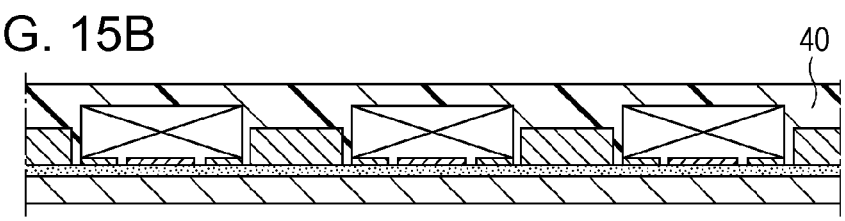
Figure 15C:
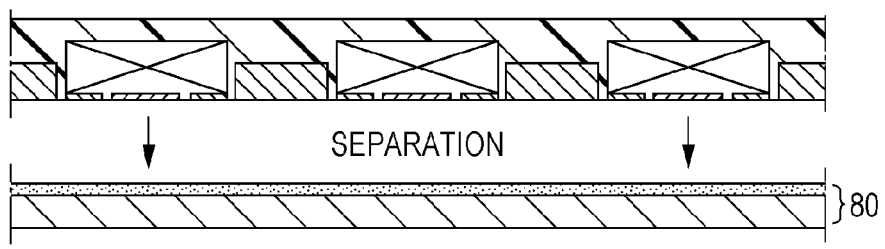
Figure 15D:
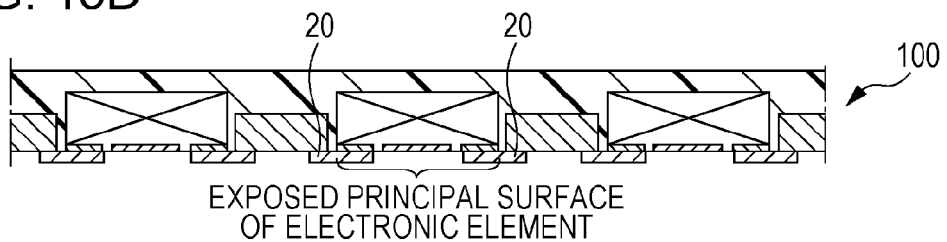
Figure 15E:
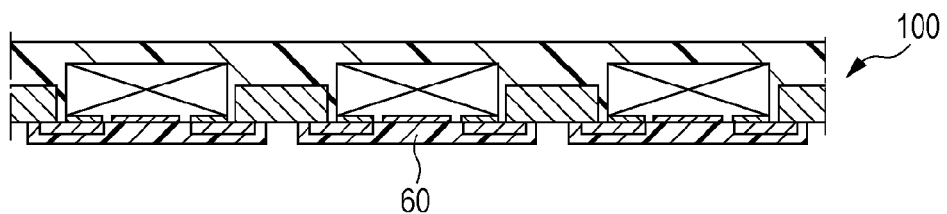
Figure 16A:
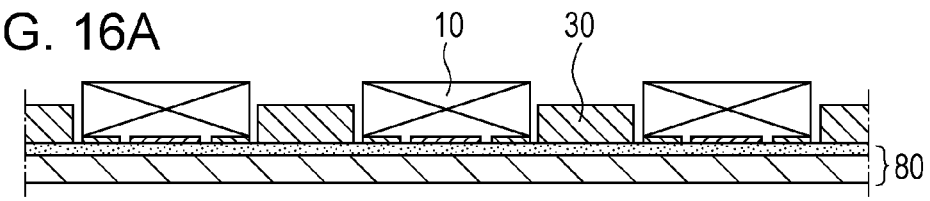
FIGS. 16A to 16E are cross sectional views illustrating, in a schematic way, successive steps of the manufacturing method (i.e., an embodiment of additionally providing the insulator) according to an embodiment of the present disclosure.
Figure 16B:
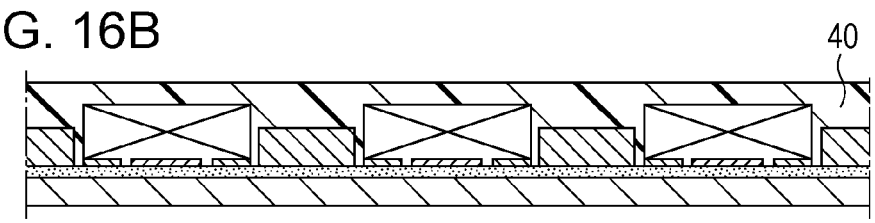
Figure 16C:
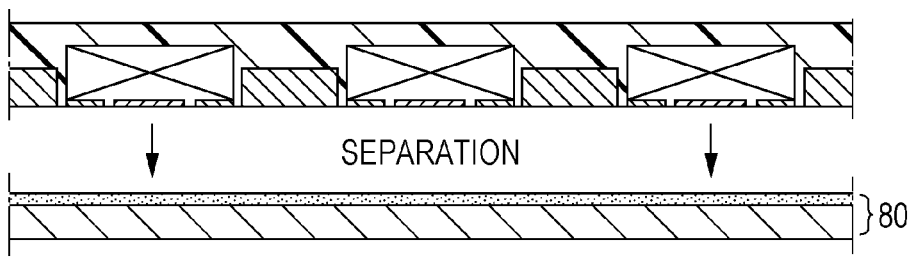
Figure 16D:
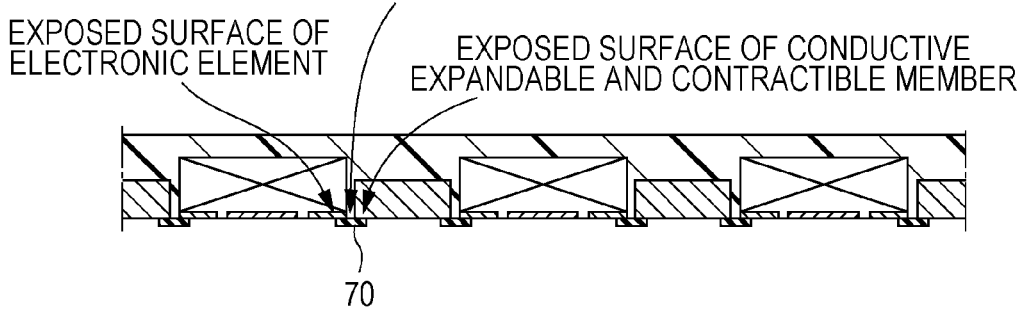
Figure 16E:
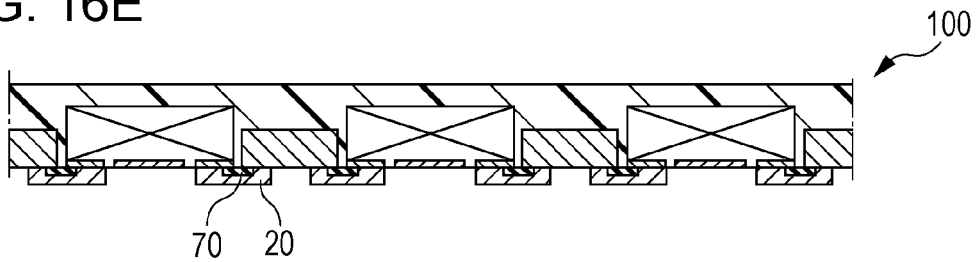

Through the process described above, the electronic device can be finally obtained in which the plural electronic elements 10 are arranged in an array and the expandable and contractible conductors 30 are also arranged in an array (see FIG. 14B).

When the electronic device 100 is obtained in the state where the electronic elements 10 are arranged in an array, the leading electrode films 20 may be formed along the first direction and the second direction in step (iv). Specifically, the leading electrode films 20 may be disposed along the first direction such that the electronic elements 10 adjacent to each other in the first direction and the expandable and contractible conductor 30 arranged between those electronic elements 10 are electrically connected to each other, whereas the leading electrode films 20 may be disposed along the second direction such that the electronic elements 10 adjacent to each other in the second direction and the expandable and contractible conductor 30 arranged between those electronic elements 10 are electrically connected to each other (see FIG. 9). In such an embodiment, the expandable and contractible conductors 30 arranged along the first direction and the expandable and contractible conductors 30 arranged along the second direction are not directly electrically connected to each other. Thus, a process for interconnecting the respective expandable and contractible conductors 30 arranged along the first direction and the second direction is not particularly required to be carried out.

Sixth Embodiment

A sixth embodiment corresponds to a method for manufacturing the electronic device according to the second embodiment. FIGS. 15A to 15E illustrate, in a schematic way, a process related to a manufacturing method according to this embodiment of the present disclosure.

The manufacturing method according to this embodiment further includes a step of additionally forming the reinforcement film 60, in addition to the steps of the manufacturing method according to the fifth embodiment. Specifically, after step (iv), the at least one reinforcement film 60 is formed to entirely cover both "the exposed principal surface of the electronic element 10 and the leading electrode films 20 connected to the electronic element 10". A plurality of reinforcement films 60 may be formed to cover all the principal surfaces of the electronic elements 10 and all the leading electrode films 20. See, particularly, FIGS. 15D and 15E.

For example, a sheet in a large size capable of entirely covering both "the exposed principal surface of the electronic element 10 and the leading electrode films 20" may be used as the reinforcement film 60. The reinforcement film 60 can be disposed by sticking such a sheet. Any type of material can be used as the reinforcement film 60 insofar as the material is able to reinforce the leading electrode film 20. For example, the reinforcement film may have in itself flexibility in a bending direction, and a certain degree of rigidity against expansion and contraction in the planar direction, thereby providing material properties that adequately serve to reinforce the leading electrode film. When utilizing a "sheet" as the reinforcement film 60, a resin sheet, such as a polyimide film, may be used.

Seventh Embodiment

A seventh embodiment corresponds to a method for manufacturing the electronic device according to the third embodiment. FIGS. 16A to 16E illustrate, in a schematic way, a process related to a manufacturing method according to this embodiment of the present disclosure.

The manufacturing method according to this embodiment further includes a step of additionally forming the insulator 70, in addition to the steps of the manufacturing method according to the fifth embodiment. Specifically, the manufacturing method includes, between step (iii) and step (iv), a step of forming the at least one insulator 70 to be contacted with the three surfaces, i.e., the "exposed principal surface of the electronic element", the "exposed surface of the expandable and contractible conductor", and the "surface of the seal positioned between the electronic element and the expandable and contractible conductor (see FIG. 16D). In step (iv), the leading electrode film 20 is formed to cover the insulator 70 (see FIG. 16E). A plurality of insulator 70 may be formed corresponding to all the leading electrode films 20.

There are no particular limitations on a method of forming the insulator 70. The method may be a method usually used in the electronics mounting field. For example, the insulator 70 can be formed by applying an insulator material over an entire relevant surface by, e.g., the spin coating method or the doctor blade method, and then by carrying out a patterning process on the applied insulator material. Alternatively, the insulator may be formed by sticking an insulating film, for example, and then by carrying out a patterning process.

Eighth Embodiment

An eighth embodiment corresponds to a method for manufacturing the electronic device according to the fourth embodiment. FIGS. 17A to 17F illustrate, in a schematic way, a process related to a manufacturing method according to this embodiment of the present disclosure.

The manufacturing method according to this embodiment further includes steps of additionally disposing one or more dummies 90, and removing the dummies 90 later, in addition to the steps of the manufacturing method according to the fifth embodiment. Specifically, when the expandable and contractible conductors 30 are disposed on the adhesive sheet in step (i), the dummies 90 are first placed on the adhesive sheet 80

Figure 17A:
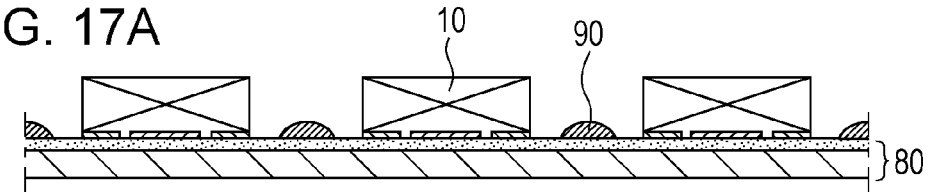
FIGS. 17A to 17F are cross sectional views illustrating, in a schematic way, successive steps of the manufacturing method (i.e., an embodiment of providing a dummy and forming the "expandable and contractible conductor" having the concave shape) according to the present disclosure.
Figure 17B:
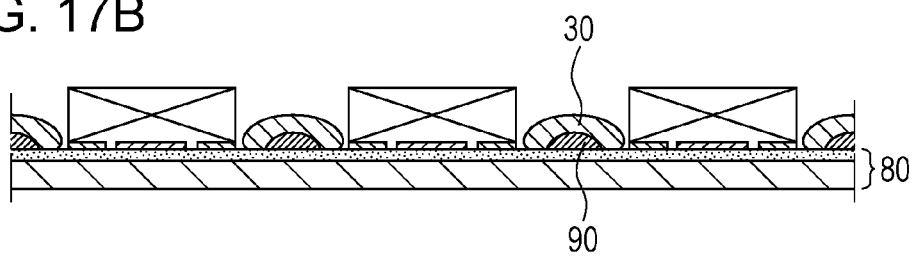
Figure 17C:
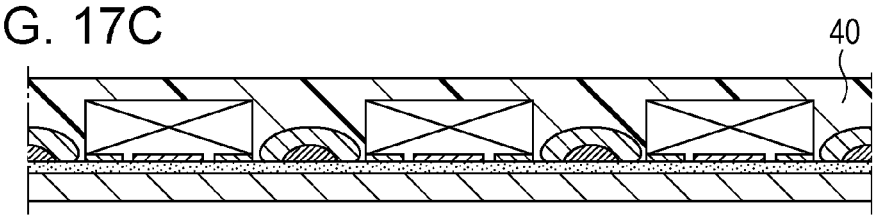
Figure 17D:
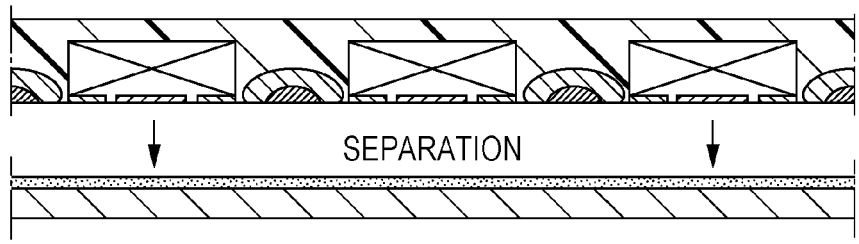
Figure 17E:
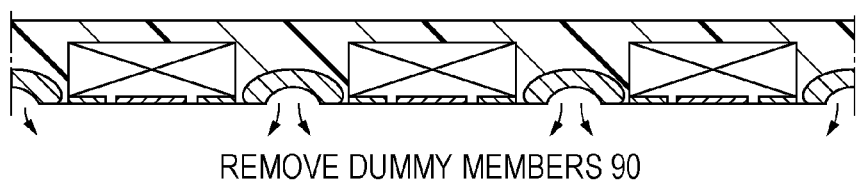
Figure 17F:
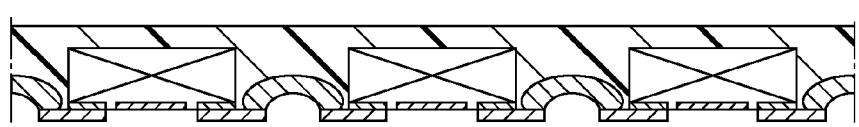

(see FIG. 17A). Thereafter, the expandable and contractible conductors 30 are disposed on the adhesive sheet 80 in a state embracing the dummies 90, respectively (see FIG. 17B). Then, after one of steps (iii) to (iv), the dummies 90 are removed from the electronic device precursor 100' (see FIG. 17E). A plurality of dummies may be formed corresponding to all the expandable and contractible conductors 30.

Through the process described above, the expandable and contractible conductors 30, each having a concave shape, can be finally obtained, and a concave surface of the expandable and contractible conductor 30, which is defined by the concave shape, can be made exposed from the seal.

The term "dummy" used in the present disclosure implies a device component (e.g., a component of an electronic device precursor) in the manufacturing process, but that is not a component in a final device. The dummy 90 may be made of a metal material that is dissoluble in an acid or alkali, for example. Though being merely illustrative, an aluminum material may be used as the dummy 90 in step (i) and, after one of steps (iii) to (iv), the dummy 90 made of the aluminum material may be dissolved and removed by employing an acid or alkali.

While the embodiments of the present disclosure have been described above, they merely represent typical examples. Thus, it is apparent to those skilled in the art that the present disclosure is not limited to the above-described embodiments, and that other various embodiments are conceivable.

For instance, the expandable and contractible conductor in the present disclosure may be used as a conductor that not only contributes to providing the expandable/contractible characteristics in the entirety of the electronic device, but also functions as a heat sink. In other words, the expandable and contractible conductor may be used as a heat dissipater to efficiently dissipate heat from the electronic element.

The expandable and contractible conductor in the present disclosure may be further used as a light reflector or a light scatterer. In particular, when a light emitting element is used as the electronic element, light from the light emitting element can be properly reflected or scattered by the expandable and contractible conductor.

Finally, remarks from the inventors related to an "increase of connection reliability", which is the advantageous effect of the present disclosure, are as follows.

When elasticity is given to an electronic device, a problem may occur with disconnection or breakdown when the electronic device is expanded or contracted, particularly with peeling-off or damage at the stuck or bonded interface between different types of materials. In related-art wire bonding, when a gold wire with a diameter of, e.g., 25 microns is used for connection, wiring is so thin and the wire tends to disconnect when expanded or contracted. Furthermore, a pad of an element electrode for wire bonding of the electronic element is also very small and has a diameter of about 100 microns. Therefore, the bonding may be separated at the pad when the wire is pulled. In addition, because the pad of the element electrode is a thin-film electrode and its thickness is about several microns at maximum, the pad of the element electrode may be itself peeled off when the wire is pulled.

In contrast, with the features of the present disclosure, the leading electrode can be formed in a width (e.g., 100 microns or more) close to that of one side of the electronic element along its outer periphery, and in a thickness of 50 microns or more. Accordingly, strength against expansion and contraction is drastically increased in comparison with that of the thin wire used in the related art.

Regarding the connection of the leading electrode to the pad of the element electrode, since the leading electrode is disposed in contact with the pad surface and is withdrawn to extend in the planer direction, no stress is applied to the bonded portion between the leading electrode and the pad of the element electrode even with expansion or contraction. Hence peeling-off at the bonded portion, separation of the pad, and other drawbacks are avoided.

Furthermore, according to the present disclosure, the active surface of the electronic element, the principal surface of the seal, and the principal surface of the expandable and contractible conductor are present in the same plane, and electric connection is established in that plane through the leading electrode, the occurrence of breakage is suppressed at the bonded interface defined by different types of members, i.e., the electronic element, the seal, and the expandable and contractible conductor, under expansion or contraction. As a result, the electronic device having high reliability can be realized. Usually, under expansion or contraction, stress tends to concentrate at a bonded surface or a portion generating a level difference between different types of materials, and separation or breakage progresses starting from a stress concentrated point. In contrast, with the features of the present disclosure, since the above-mentioned three surfaces are present in the "same plane" and there is no level difference, concentration of stress is suppressed. Moreover, since the bonded interface between the different types of materials is covered with the leading electrode, the leading electrode reinforces the bonded interface between the different types of materials, thus greatly increasing the strength against expansion and contraction.

The present disclosure involves the following embodiments.

An electronic device of an embodiment of the present disclosure includes: electronic elements having principal surfaces; expandable and contractible conductors each disposed between two of the electronic elements adjacent to each other, and each having a first surface; a seal which covers the electronic elements and the conductors except the principal surfaces of the electronic elements and the first surfaces of the conductors, the principal surfaces of the electronic elements and the first surfaces of the conductors being present on a same plane on which surfaces of the seal each positioned between one of the electronic elements and one of the conductors are present; and leading electrode films each of which is attached in a film-like form to three surfaces which are the surface of the seal positioned between one of the electronic elements and one of the conductors, the first surface of the conductor, and part of the principal surface of the electronic element, to electrically connect the electronic element and the conductor through the leading electrode film.

The present embodiment can provide a significant advantageous effect of increasing connection reliability of the electronic device attributable to the features that the leading electrode film is itself in a "film-like form" having a large width, and that the leading electrode film is attached to the above-mentioned "three surfaces in one plane".

The electronic elements and the conductors, both being covered with the seal, may be positioned on the same plane. The leading electrode films not covered with the seal may be positioned on the same plane to face the electronic elements and the conductors in opposing relation.

The electronic device may be, as a whole, expandable and contractible, due to the expandable and contractible conductors.

The electronic elements may be arranged in an array.

The conductors may exhibit electric conductivity attributable to a material of the conductors or a conductive material contained therein. The conductors may exhibit elasticity attributable to at least one of a three-dimensional form of the conductors and the material of the conductors.

The conductors may be made of metal, having a bellows shape or a spiral shape.

The conductors may be rubber-like conductors containing conductive fillers.

The electronic elements may be light emitting elements, and the principal surfaces of the electronic elements may be active surfaces of the light emitting elements.

The electronic device may further comprise one or more reinforcement films each entirely covering the principal surface of a corresponding one of the electronic elements and the leading electrode films attached to the corresponding electronic element except surfaces attached to the three surfaces.

The electronic device may further includes one or more insulators. Each of the insulators is covered by a corresponding one of the leading electrode films and is contacted with the three surfaces which are the surface of the seal positioned between one of the electronic elements and one of the conductors, the first surface of the conductor, and part of the principal surface of the electronic element.

At least one of the conductors may have a concave shape and a concave surface defined by the concave shape, the concave surface not being covered by the seal.

The electronic elements may be two dimensionally arrayed along a first direction and a second direction. Each of the conductors may be arranged between two of the electronic elements adjacent to each other in the first direction or in the second direction. Two of the electronic elements adjacent to each other in the first direction and the conductor arranged between the adjacent electronic elements are electrically connected through two of the leading electrode films arranged along the first direction. Two of the electronic elements adjacent to each other in the second direction and the conductor arranged between the adjacent electronic elements are electrically connected through two of the leading electrode films arranged along the second direction. The conductors each of which is arranged between two of the electronic elements adjacent to each other in the first direction may not be directly connected to the conductors each of which is arranged between two of the electronic elements adjacent to each other in the second direction.

The leading electrode films may have a double-layer structure of a dry plating layer and a wet plating layer.

A method according to an embodiment of the present disclosure comprises the steps of: (i) placing expandable and contractible conductors and electronic elements on an adhesive sheet, to provide each of the conductors between two of the electronic elements adjacent to each other; (ii) forming a seal over the adhesive sheet to cover the electronic elements and the conductors except principal surfaces of the electronic elements and first surfaces of the conductors in contact with the adhesive sheet, and obtaining an electronic device precursor; (iii) separating the adhesive sheet from the electronic device precursor, wherein the principal surfaces of the electronic elements not covered by the seal, the first surfaces of the conductors not covered by the seal, and surfaces of the seal each positioned between one of the electronic elements and one of the conductors are on a same plane; and (iv) forming leading electrode films each of which is attached in a film-like form to three surfaces which are the surface of the seal positioned between one of the electronic elements and one of the conductors, the uncovered first surface of the conductor, and part of the uncovered principal surface of the electronic element.

In the step (i), the electronic elements may be placed on the adhesive sheet to be arranged in an array.

The conductors placed on the adhesive sheet in the step (i) may have electric conductivity attributable to a material of the conductors or a conductive material contained therein, and may have elasticity attributable to at least one of a three-dimensional form and the material of the conductor.

In the step (iv), the leading electrode films may be formed by carrying out a wet plating method after carrying out a dry plating method to have a double-layer structure of a dry plating layer and a wet plating layer to have a double-layer structure of a dry plating layer and a wet plating layer.

Light emitting elements having active surfaces may be used as the electronic elements in the step (i), the active surfaces of the light emitting elements may be not covered by the seal in the step (iii), and the leading electrode films may be formed to be connected to parts of the active surfaces of the light emitting elements in the step (iv).

The electronic device manufacturing method may further includes after the step (iv), a step of forming one or more reinforcement films each of which entirely covers the uncovered principal surface of a corresponding one of the electronic elements and the leading electrode films attached to the corresponding electronic element except surfaces attached to the three surfaces.

The electronic device manufacturing method may further includes, between the steps (iii) and (iv), a step of forming one or more insulators each of which is contacted with three surfaces which are the surface of the seal positioned between one of the electronic elements and one of the conductors, the uncovered first surface of the conductor, and part of the uncovered principal surface of the electronic element. In this case, in the step (iv), one or more of the leading electrode films are formed to cover the insulators.

In the step (i), one or more dummies may be placed on the adhesive sheet and, thereafter, one or more of the conductors are disposed on the adhesive sheet in a state embracing the dummies, respectively, and after any one of the steps (iii) to (iv), the dummies are removed from the electronic device precursor to obtain the conductors each having a concave shape and a concave surface defined by the concave shape, the concave shape being not covered by the seal.

In the step (i), the electronic elements may be placed to be two dimensionally arrayed along a first direction and a second direction, and each of the conductors is placed to be arranged between two of the electronic elements adjacent to each other in the first direction or in the second direction. In the step (iv), part of the leading electrode films are arranged along the first direction to electrically connect the electronic elements adjacent to each other in the first direction and the conductors arranged between the adjacent electronic elements, whereas other part of the leading electrode films are arranged along the second direction to electrically connect the electronic elements adjacent to each other in the second direction and the conductors arranged between the adjacent electronic elements.

It is to noted that the electronic device and the manufacturing method for the electronic device, according to the present disclosure, are not limited to the above-described embodiments, and that various combinations and modifications of the embodiments are also involved in the present disclosure.

The electronic device of the present disclosure can be used in a wide variety of applications including display devices, such as an advertisement medium capable of being arranged in a freely curved surface, a display device for wearable equipment, and a sensing device.

What is claimed is:

1. An electronic device comprising:
   electronic elements having principal surfaces;
   expandable and contractible conductors each disposed between two of the electronic elements adjacent to each other, and each having a first surface;
   a seal which covers the electronic elements and the conductors except the principal surfaces of the electronic elements and the first surfaces of the conductors, the principal surfaces of the electronic elements and the first surfaces of the conductors being present on a same plane on which surfaces of the seal each positioned between one of the electronic elements and one of the conductors are present; and
   leading electrode films each of which is attached in a film-like form to three surfaces which are the surface of the seal positioned between one of the electronic elements and one of the conductors, the first surface of the conductor, and part of the principal surface of the electronic element, to electrically connect the electronic element and the conductor through the leading electrode film.

2. The electronic device of claim 1, wherein the electronic elements and the conductors, both being covered with the seal, are positioned on the same plane, and the leading electrode films not covered with the seal are positioned on the same plane to face the electronic elements and the conductors in opposing relation.

3. The electronic device of claim 1, wherein the electronic device is, as a whole, expandable and contractible, due to the expandable and contractible conductors.

4. The electronic device of claim 1, wherein the electronic elements are arranged in an array.

5. The electronic device of claim 1, wherein the conductors exhibit electric conductivity attributable to a material of the conductors or a conductive material contained therein, and exhibit elasticity attributable to at least one of a three-dimensional form of the conductors and the material of the conductors.

6. The electronic device of claim 5, wherein the conductors are made of metal, having a bellows shape or a spiral shape.

7. The electronic device of claim 5, wherein the conductors are rubber-like conductors containing conductive fillers.

8. The electronic device of claim 1, wherein the electronic elements are light emitting elements, and the principal surfaces of the electronic elements are active surfaces of the light emitting elements.

9. The electronic device of claim 1, further comprising one or more reinforcement films each entirely covering the principal surface of a corresponding one of the electronic elements and the leading electrode films attached to the corresponding electronic element except surfaces attached to the three surfaces.

10. The electronic device of claim 1, further comprising one or more insulators each of which is covered by a corresponding one of the leading electrode films and is contacted with the three surfaces which are the surface of the seal positioned between one of the electronic elements and one of the conductors, the first surface of the conductor, and part of the principal surface of the electronic element.

11. The electronic device of claim 1, wherein at least one of the conductors has a concave shape and a concave surface defined by the concave shape, the concave surface not being covered by the seal.

12. The electronic device of claim 1, wherein the electronic elements are two dimensionally arrayed along a first direction and a second direction,
   each of the conductors is arranged between two of the electronic elements adjacent to each other in the first direction or in the second direction,
   two of the electronic elements adjacent to each other in the first direction and the conductor arranged between the adjacent electronic elements are electrically connected through two of the leading electrode films arranged along the first direction, whereas two of the electronic elements adjacent to each other in the second direction and the conductor arranged between the adjacent electronic elements are electrically connected through two of the leading electrode films arranged along the second direction, and
   the conductors each of which is arranged between two of the electronic elements adjacent to each other in the first direction are not directly connected to the conductors each of which is arranged between two of the electronic elements adjacent to each other in the second direction.

13. The electronic device of claim 1, wherein the leading electrode films have a double-layer structure of a dry plating layer and a wet plating layer.

14. A method of manufacturing an electronic device including a plurality of electronic elements, the method comprising the steps of:
   (i) placing expandable and contractible conductors and the electronic elements on an adhesive sheet, to provide each of the conductors between two of the electronic elements adjacent to each other;
   (ii) forming a seal over the adhesive sheet to cover the electronic elements and the conductors except principal surfaces of the electronic elements and first surfaces of the conductors in contact with the adhesive sheet, and obtaining an electronic device precursor;
   (iii) separating the adhesive sheet from the electronic device precursor, wherein the principal surfaces of the electronic elements not covered by the seal, the first surfaces of the conductors not covered by the seal, and surfaces of the seal each positioned between one of the electronic elements and one of the conductors are on a same plane; and
   (iv) forming leading electrode films each of which is attached in a film-like form to three surfaces which are the surface of the seal positioned between one of the electronic elements and one of the conductors, the uncovered first surface of the conductor, and part of the uncovered principal surface of the electronic element.

15. The electronic device manufacturing method of claim 14, wherein, in the step (i), the electronic elements are placed on the adhesive sheet to be arranged in an array.

16. The electronic device manufacturing method of claim 14, wherein the conductors placed on the adhesive sheet in the step (i) have electric conductivity attributable to a material of the conductors or a conductive material contained therein, and have elasticity attributable to at least one of a three-dimensional form and the material of the conductor.

17. The electronic device manufacturing method of claim 14, wherein, in the step (iv), the leading electrode films are formed by carrying out a wet plating method after carrying out a dry plating method to have a double-layer structure of a dry plating layer and a wet plating layer.

18. The electronic device manufacturing method of claim 14, wherein light emitting elements having active surfaces as principal surfaces are used as the electronic elements in the step (i), the active surfaces of the light emitting elements are not covered by the seal in the step (iii), and the leading electrode films are formed to be connected to parts of the active surfaces of the light emitting elements in the step (iv).

19. The electronic device manufacturing method of claim 14, further comprising, after the step (iv), a step of forming one or more reinforcement films each of which entirely covers the uncovered principal surface of a corresponding one of the electronic elements and the leading electrode films attached to the corresponding electronic element except surfaces attached to the three surfaces.

20. The electronic device manufacturing method of claim 14, further comprising, between the steps (iii) and (iv), a step of forming one or more insulators each of which is contacted with three surfaces which are the surface of the seal positioned between one of the electronic elements and one of the conductors, the uncovered first surface of the conductor, and part of the uncovered principal surface of the electronic element, wherein, in the step (iv), one or more of the leading electrode films are formed to cover the insulators.

21. The electronic device manufacturing method of claim 14, wherein in the step (i), one or more dummies are placed on the adhesive sheet and, thereafter, one or more of the conductors are disposed on the adhesive sheet in a state embracing the dummies, respectively, and after any one of the steps (iii) to (iv), the dummies are removed from the electronic device precursor to obtain the conductors each having a concave shape and a concave surface defined by the concave shape, the concave shape being not covered by the seal.

22. An electronic device comprising:

electronic elements having principal surfaces;

expandable and contractible conductors each disposed between two of the electronic elements adjacent to each other, and each having a first surface;

a seal which covers the electronic elements and the conductors except the principal surfaces of the electronic elements and the first surfaces of the conductors, the principal surfaces of the electronic elements and the first surfaces of the conductors being present on a same plane on which surfaces of the seal each positioned between one of the electronic elements and one of the conductors are present; and leading electrode films each of which is attached by direct contact in a film-like form to three surfaces which are the surface of the seal positioned between one of the electronic elements and one of the conductors, the first surface of the conductor, and part of the principal surface of the electronic element, to electrically connect the electronic element and the conductor through the leading electrode film.

* * * * *